(12) United States Patent
Hwang et al.

(10) Patent No.: US 11,621,367 B2
(45) Date of Patent: Apr. 4, 2023

(54) LED DEVICE, METHOD OF MANUFACTURING THE LED DEVICE, AND DISPLAY APPARATUS INCLUDING THE LED DEVICE

(71) Applicant: SAMSUNG ELECTRONICS CO., LTD., Suwon-si (KR)

(72) Inventors: Junsik Hwang, Hwaseong-si (KR); Kyungwook Hwang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 28 days.

(21) Appl. No.: 16/933,187

(22) Filed: Jul. 20, 2020

(65) Prior Publication Data

US 2021/0249556 A1 Aug. 12, 2021

(30) Foreign Application Priority Data

Feb. 12, 2020 (KR) .................. 10-2020-0017143

(51) Int. Cl.
*H01L 33/38* (2010.01)
*H01L 33/00* (2010.01)
(Continued)

(52) U.S. Cl.
CPC ...... *H01L 33/0093* (2020.05); *H01L 25/0753* (2013.01); *H01L 33/007* (2013.01);
(Continued)

(58) Field of Classification Search
CPC ......... H01L 25/0753; H01L 2933/0016; H01L 2933/0025; H01L 33/007; H01L 33/0093;
(Continued)

(56) References Cited

U.S. PATENT DOCUMENTS 9,112,114 B2 * 8/2015 Park ..................... H01L 33/40
9,793,359 B2 10/2017 Yoon et al.
(Continued)

FOREIGN PATENT DOCUMENTS

KR 1020120129439 A 11/2012
KR 1020140142056 A 12/2014
KR 1020180123375 A 11/2018

OTHER PUBLICATIONS

Lee, H. E., et al., "Monolithic Flexible Vertical GaN Light-Emitting Diodes for a Transparent Wireless Brain Optical Stimulator", Advanced Materials, 2018, vol. 30, pp. 1-10.

*Primary Examiner* — Matthew C Landau
*Assistant Examiner* — Dmitriy Yemelyanov
(74) *Attorney, Agent, or Firm* — Sughrue Mion, PLLC

(57) ABSTRACT

A light-emitting diode (LED) device includes a light-emitting layer having a core-shell structure that comprises a first semiconductor layer, an active layer, and a second semiconductor layer; a passivation layer formed to cover at least a portion of a side surface and a portion of an upper surface of the second semiconductor layer; a first electrode formed on a portion of the passivation layer that is located on a side surface of the light-emitting layer, the first electrode electrically connected to the first semiconductor layer and including a reflective material; and a second electrode formed on a portion of the passivation layer that is located on an upper surface of the light-emitting layer, the second electrode contacting a portion of the upper surface of the second semiconductor layer that is exposed.

13 Claims, 27 Drawing Sheets

(51) Int. Cl.
- *H01L 33/24* (2010.01)
- *H01L 33/40* (2010.01)
- *H01L 33/44* (2010.01)
- *H01L 25/075* (2006.01)
- *H01L 33/32* (2010.01)
- *H01L 33/12* (2010.01)
- *H01L 33/42* (2010.01)

(52) U.S. Cl.
CPC ............ *H01L 33/24* (2013.01); *H01L 33/385* (2013.01); *H01L 33/405* (2013.01); *H01L 33/44* (2013.01); *H01L 33/12* (2013.01); *H01L 33/32* (2013.01); *H01L 33/42* (2013.01); *H01L 2933/0016* (2013.01); *H01L 2933/0025* (2013.01)

(58) Field of Classification Search
CPC ......... H01L 33/12; H01L 33/24; H01L 33/32; H01L 33/385; H01L 33/405; H01L 33/42; H01L 33/44

See application file for complete search history.

(56) References Cited

U.S. PATENT DOCUMENTS

| | | | |
|---|---|---|---|
| 9,825,202 | B2 | 11/2017 | Schuele et al. |
| 10,205,052 | B2 | 2/2019 | Yoon et al. |
| 10,297,722 | B2 | 5/2019 | Chang et al. |
| 2003/0025212 | A1 | 2/2003 | Bhat et al. |
| 2013/0181249 | A1* | 7/2013 | Aoyagi ................. H01L 33/385 438/22 |
| 2014/0361321 | A1* | 12/2014 | Saito ................... H01L 33/0093 257/89 |
| 2017/0213938 | A1 | 7/2017 | Bae et al. |
| 2020/0035890 | A1* | 1/2020 | Yoon ....................... H01L 33/60 |
| 2020/0152832 | A1* | 5/2020 | Yoon ....................... H01L 33/36 |
| 2021/0320226 | A1* | 10/2021 | Sugawara ............ H01L 33/382 |

* cited by examiner

< Top >

< Bottom >

LED DEVICE, METHOD OF MANUFACTURING THE LED DEVICE, AND DISPLAY APPARATUS INCLUDING THE LED DEVICE

CROSS-REFERENCE TO THE RELATED APPLICATION

This application is based on and claims priority under 35 U.S.C. § 119 to Korean Patent Application No. 10-2020-0017143, filed on Feb. 12, 2020, in the Korean Intellectual Property Office, the disclosure of which is incorporated herein in its entirety by reference.

BACKGROUND

1. Field

Embodiments of the present disclosure relate to light-emitting diode (LED) devices, methods of manufacturing the same, and display apparatuses including the LED devices.

2. Description of Related Art

Display apparatuses, such as liquid crystal displays (LCDs) and organic light-emitting diode (OLED) displays, have been widely used. Recently, a technology for manufacturing a high-resolution display apparatus that uses a micro light-emitting diode device has drawn attention.

SUMMARY

Provided are light-emitting diode (LED) devices, methods of manufacturing the same, and display apparatuses including the LED devices.

Additional aspects will be set forth in part in the description which follows and, in part, will be apparent from the description, or may be learned by practice of the presented embodiments of the disclosure.

According to one or more embodiments, a light-emitting diode (LED) device is provided. The LED device includes a light-emitting layer having a core-shell structure that comprises a first semiconductor layer, an active layer, and a second semiconductor layer; a passivation layer formed to cover at least a portion of a side surface and a portion of an upper surface of the second semiconductor layer; a first electrode formed on a portion of the passivation layer that is located on a side surface of the light-emitting layer, the first electrode electrically connected to the first semiconductor layer and comprising a reflective material; and a second electrode formed on a portion of the passivation layer that is located on an upper surface of the light-emitting layer, the second electrode contacting a portion of the upper surface of the second semiconductor layer that is exposed.

According to an embodiment, the first semiconductor layer has a three-dimensional (3D) shape, the active layer is formed to cover an upper surface and a side surface of the first semiconductor layer, and the second semiconductor layer is formed to cover an upper surface and a side surface of the active layer.

According to an embodiment, the passivation layer covers an entirety of the side surface of the light-emitting layer, and further covers a portion of a lower surface of the first semiconductor layer and the portion of the upper surface of the second semiconductor layer.

According to an embodiment, the first electrode extends to the portion of the passivation layer located on the upper surface of the light-emitting layer.

According to an embodiment, the first electrode surrounds the entirety of the side surface of the light-emitting layer.

According to an embodiment, the LED device further includes a transparent electrode covering an exposed lower surface of the first semiconductor layer.

According to an embodiment, the transparent electrode is electrically connected to the first electrode.

According to an embodiment, the first electrode extends to contact the transparent electrode.

According to an embodiment, the transparent electrode is provided on a portion on the passivation layer that is located under the light-emitting layer.

According to an embodiment, a via hole for electrically connecting the first semiconductor layer to the first electrode is formed in the light-emitting layer.

According to an embodiment, the via hole is formed in a region corresponding to the first electrode on the light-emitting layer.

According to an embodiment, the first electrode is separated from an end of the active layer and an end of the second semiconductor layer exposed by the via hole with the passivation layer therebetween.

According to an embodiment, the first electrode is formed to cover the entirety of the side surface of the light-emitting layer.

According to an embodiment, the first electrode is a reflective electrode.

According to an embodiment, the LED device has a size of 10 μm×10 μm or less.

According to one or more embodiments, a display apparatus is provided. The display apparatus includes: a plurality of pixels that are two-dimensionally (2D) arranged and are configured to emit light of different colors, wherein the plurality of pixels comprises a plurality of LED devices. Each of the plurality of LED devices includes: a light-emitting layer having a core-shell structure that comprises a first semiconductor layer, an active layer, and a second semiconductor layer; a passivation layer formed to cover a portion of an upper surface of the second semiconductor layer; a first electrode provided on a portion of the passivation layer that is located on a side of the light-emitting layer, the first electrode electrically connected to the first semiconductor layer and comprising a reflective material; and a second electrode formed on a portion of the passivation layer that is located on an upper surface of the light-emitting layer, the second electrode contacting a portion of the upper surface of the second semiconductor layer that is exposed.

According to one or more embodiments, a method of manufacturing a light-emitting diode (LED) device is provided. The method includes: forming a membrane on a substrate; forming a light-emitting layer by sequentially depositing a three-dimensional (3D) first semiconductor layer on the membrane, an active layer to cover an upper surface and a side surface of the first semiconductor layer, and a second semiconductor layer to cover an upper surface and a side surface of the active layer; forming a first electrode on a side surface of the light-emitting layer such that the first electrode is electrically connected to the first semiconductor layer; and forming a second electrode on an upper surface of the light-emitting layer such that the second electrode contacts the second semiconductor layer.

According to an embodiment, the membrane includes a crystallized material.

According to an embodiment, the membrane includes any one of alumina ($Al_2O_3$), silica ($SiO_2$), titania ($TiO_2$), zirconia ($ZrO_2$), yttria ($Y_2O_3$)-zirconia, copper oxide (CuO or $Cu_2O$), tantalum oxide ($Ta_2O_5$), aluminum nitride (AlN), and silicon nitride ($Si_3N_4$).

According to an embodiment, the forming the membrane includes: forming a sacrifice layer pattern on the substrate; forming a membrane material layer to cover the sacrifice layer pattern on the substrate; removing the sacrifice layer pattern; and crystallizing the membrane material layer.

According to an embodiment, the method further includes: forming a passivation layer to cover the light-emitting layer before forming the first electrode and the second electrode; and exposing a portion of an upper surface of the second semiconductor layer by etching the passivation layer.

According to an embodiment, the first electrode is formed on a portion of the passivation layer that is located on the side surface of the light-emitting layer, and the second electrode is formed on a portion of the passivation layer that is located on the upper surface of the light-emitting layer so as to contact the portion of the upper surface of the second semiconductor layer exposed by the passivation layer.

According to an embodiment, the first electrode is formed to extend to the portion of the passivation layer that is located on the upper surface of the light-emitting layer.

According to an embodiment, the method further includes exposing a portion of a lower surface of the first semiconductor layer by removing the membrane.

According to an embodiment, the method further includes: forming a transparent electrode to cover the lower surface of the first semiconductor layer, that is exposed, and to electrically connect to the first electrode.

According to an embodiment, the method further includes forming a via hole for electrically connecting the first semiconductor layer to the first electrode in the light-emitting layer.

According to an embodiment, the method further includes forming a passivation layer to cover the light-emitting layer; and exposing a portion of an upper surface of the second semiconductor layer, and a portion of the upper surface of the first semiconductor layer provided in the via hole, by etching the passivation layer.

According to an embodiment, the first electrode is formed on a portion of the passivation layer that is located on the side surface of the light-emitting layer so as to contact the portion of the upper surface of the first semiconductor layer exposed by the via hole, and the second electrode is formed on a portion of the passivation layer that is located on the upper surface of the light-emitting layer so as to contact the portion of the upper surface of the second semiconductor layer exposed by the passivation layer.

According to an embodiment, the first electrode is formed to extend to the portion of the passivation layer that is located on the upper surface of the light-emitting layer.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 17 is a second view for explaining the method of manufacturing the LED device according to the another embodiment;

DETAILED DESCRIPTION

Figure 1:
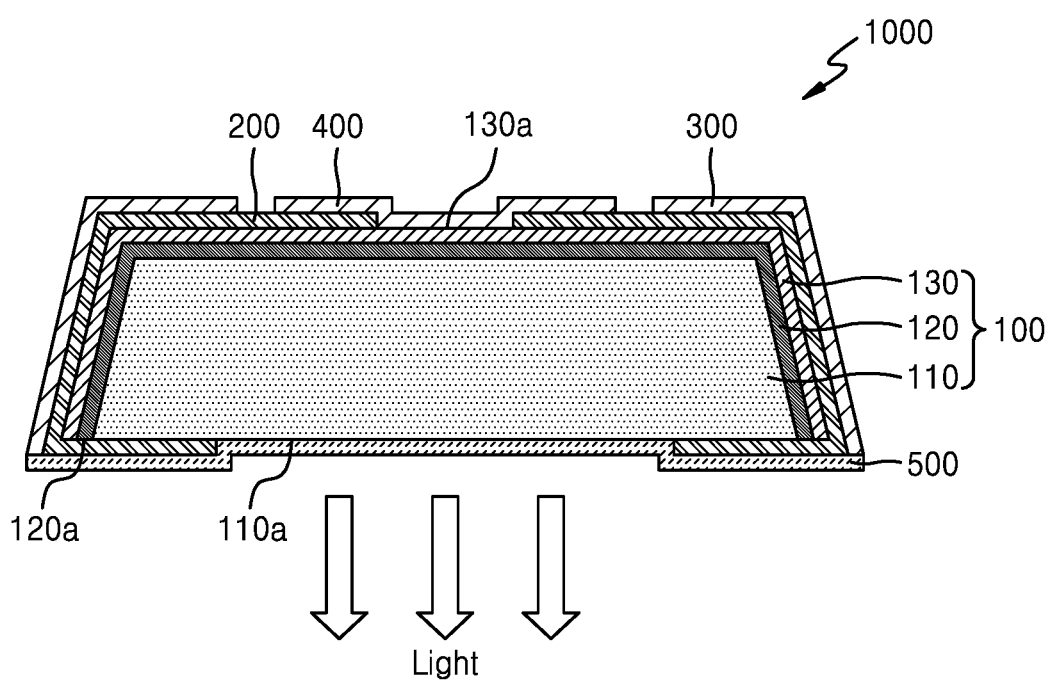
FIG. 1 is a schematic side cross-sectional view of a light-emitting diode (LED) device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

In the drawings, size or thickness of each constituent element may be exaggerated for clarity and convenience of explanation.

When an element or layer is referred to as being "on" or "above" another element or layer, the element or layer may be directly on another element or layer or intervening elements or layers. The singular forms include the plural forms unless the context clearly indicates otherwise. It should be understood that, when a part "comprises" or "includes" an element in the specification, unless otherwise defined, it is not excluding other elements but may further include other elements.

The term "above" and similar directional terms may be applied to both singular and plural. With respect to operations that constitute a method, the operations may be performed in any appropriate sequence unless the sequence of operations is clearly described. The operations may not necessarily be performed in the order of sequence.

Although the terms 'first', 'second', etc. may be used herein to describe various constituent elements, these constituent elements should not be limited by these terms. The terms are only used to distinguish one constituent element from another.

Figure 2:
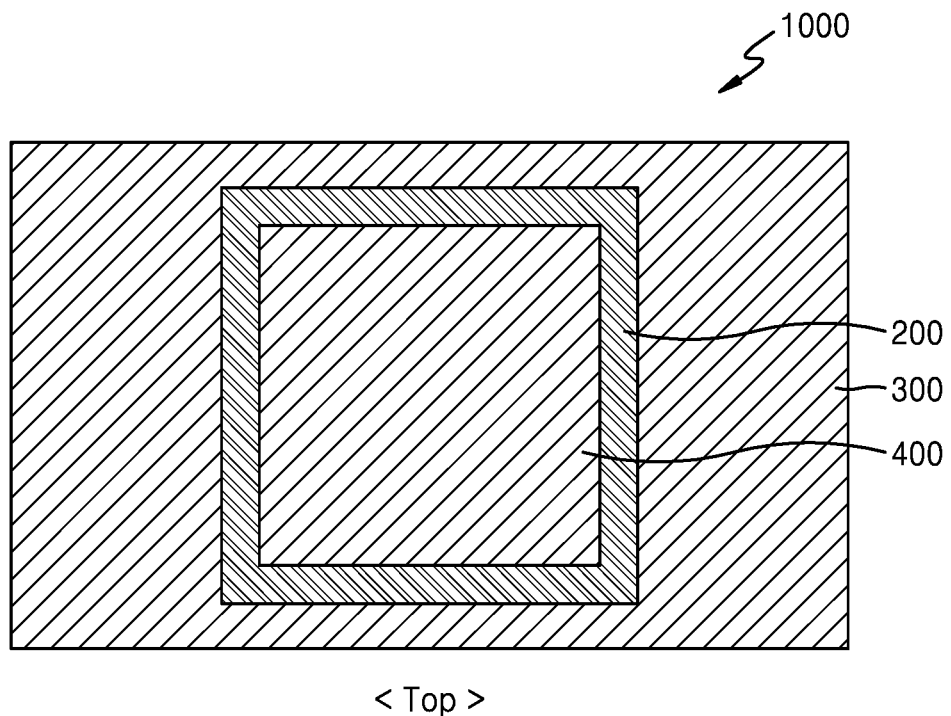
FIG. 2 is a plan view showing a configuration of the LED device of FIG. 1.
Figure 3:
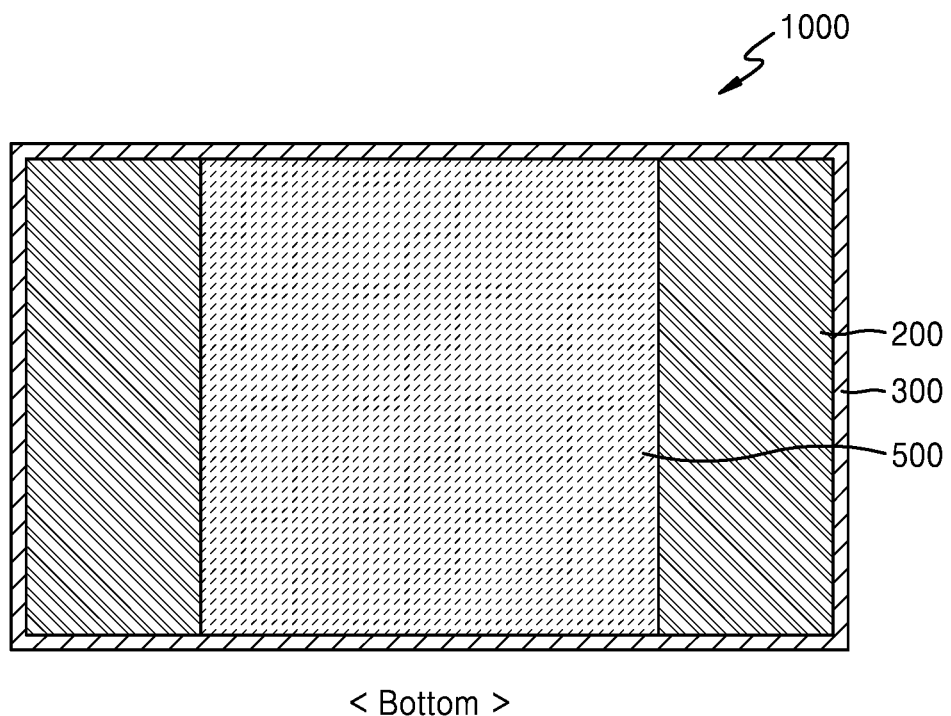
FIG. 3 is a bottom view showing a configuration of the LED device of FIG. 1.

FIG. 1 is a schematic side cross-sectional view of a light-emitting diode (LED) device 1000 according to an embodiment. FIG. 2 is a plan view showing a brief configuration of the LED device 1000 of FIG. 1. FIG. 3 is a bottom view showing a simplified configuration of the LED device 1000 of FIG. 1.

Referring to FIG. 1, the LED device 1000 may include: a light-emitting layer 100 having a core-shell structure and including a first semiconductor layer 110, an active layer 120, and a second semiconductor layer 130; a passivation layer 200 formed to cover at least a portion of a side surface and upper surface of the second semiconductor layer 130; a first electrode 300 that is provided on a portion of the passivation layer 200 located on a side surface of the light-emitting layer 100, is electrically connected to the first semiconductor layer 110, and includes a reflective material; a second electrode 400 that is provided on the passivation layer 200 located on an upper surface of the light-emitting layer 100 and contacts a portion of an exposed upper surface of the second semiconductor layer 130.

The light-emitting layer 100 may have a core-shell structure. Here, the core-shell structure may denote a structure in which a shell provided on an outside of the structure surrounds a core provided on an inside thereof. The light-emitting layer 100 of FIG. 1 may have a core-shell structure in which a part of the core (e.g., a lower surface of the core) is not covered by the shell and is exposed. In this case, light may be emitted from the part of the core exposed by the shell. The light-emitting layer 100 may include the first semiconductor layer 110, the active layer 120, and the second semiconductor layer 130. The first semiconductor layer 110 may correspond to a core of the core-shell structure and may have a three-dimensional (3D) shape having a relatively greater thickness than the active layer 120 and the second semiconductor layer 130.

The first semiconductor layer 110 may include, for example, an n-type semiconductor. However, the present embodiment is not limited thereto, and in some cases, the first semiconductor layer 110 may include a p-type semiconductor. For example, the first semiconductor layer 110 may include a Group III-V n-type semiconductor, for example, an n-type nitride semiconductor. Here, the nitride semiconductor may include, for example, GaN, InN, AlN, or a combination thereof, but is not limited thereto. For example, the first semiconductor layer 110 may include n-GaN. The first semiconductor layer 110 may have a single layer or multilayer structure.

The active layer 120 and the second semiconductor layer 130 may correspond to a shell of the core-shell structure, and may have a relatively smaller thickness than the first semiconductor layer 110. The active layer 120 may be formed to cover upper and side surfaces of the first semiconductor layer 110 having a 3D shape, and the second semiconductor layer 130 may be formed to cover upper and side surfaces of the active layer 120. Accordingly, a lower surface of the first semiconductor layer 110 may be exposed without being covered by the active layer 120 and the second semiconductor layer 130. The exposed lower surface of the first semiconductor layer 110 may be a surface from which light generated from the active layer 120 is emitted.

In the active layer 120, light of a predetermined wavelength band may be generated by combining electrons and holes. The active layer 120 may have a multi-quantum well (MQW) structure. However, the present embodiment is not limited thereto, and in some cases, the active layer 120 may have a single-quantum well (SQW) structure. The active layer 120 may include a Group III-V semiconductor, such as a nitride semiconductor. For example, the active layer 120 may include GaN.

The second semiconductor layer 130 may be formed to cover the upper and side surfaces of the active layer 120. The second semiconductor layer 130 may include, for example, a p-type semiconductor. However, the present embodiment is not limited thereto, and in some cases, the second semiconductor layer 130 may include an n-type semiconductor. The second semiconductor layer 130 may include a Group III-V p-type semiconductor, for example, a p-type nitride semiconductor. For example, the second semiconductor layer 130 may include p-GaN. The second semiconductor layer 130 may have a single layer or multilayer structure.

The light-emitting layer 100 of the core-shell structure as described above may be formed by growing by using, for example, a metal organic chemical vapor deposition (MOCVD) on a crystallized membrane that is separated from a substrate with a cavity therebetween, which will be described below.

The crystallized membrane may serve as a seed layer for growing the light-emitting layer 100. Also, since the membrane may ease stress that may cause dislocation by dividing the stress with the light-emitting layer 100 grown thereon, the light-emitting layer 100 grown on the membrane may have high quality with a small defect density.

A passivation layer 200 may be provided on the light-emitting layer 100. The passivation layer 200 may be formed to cover a surface of the light-emitting layer 100 except for a portion 110a of a lower surface of the first semiconductor layer 110 and a portion 130a of an upper surface of the second semiconductor layer 130. The passivation layer 200 may be formed to cover the entire side surface of the light-emitting layer 100. Accordingly, the passivation layer 200 may be formed to cover an end portion 120a of the active layer 120 exposed on a lower surface of the light-emitting layer 100. Accordingly, light that may emit from the end portion 120a of the active layer 120 may be blocked, and thus, light extraction efficiency may be increased. The passivation layer 200 may include, for example, silicon oxide or silicon nitride, but this is merely an example.

The first electrode 300 is provided on the passivation layer 200 and may be electrically connected to the first semiconductor layer 110. For example, the first electrode 300 may be provided on a portion of the passivation layer 200 located on a side of the light-emitting layer 100. For example, the first electrode 300 may be formed to surround the entire side surface of the light-emitting layer 100. In addition, the first electrode 300 may be formed to extend to a portion of the passivation layer 200 located on the upper surface of the light-emitting layer 100. Accordingly, the first electrode 300 may also be formed on a portion of the upper surface of the light-emitting layer 100. As described below, the first electrode 300 is provided to be electrically connected to the first semiconductor layer 110 through a transparent electrode 500. For example, the first electrode 300 may be formed to contact the transparent electrode 500 that is in contact with a portion 110a of the lower surface of the first semiconductor layer 110. The structure of the transparent electrode 500 will be described later. The first electrode 300 may be a reflective electrode. When the first semiconductor layer 110 includes, for example, an n-type nitride semiconductor, the first electrode 300 may be an n-type electrode. The first electrode 300 may include a metal material having high conductivity. Accordingly, the first electrode 300 surrounding the side surface of the light-emitting layer 100 may serve as a reflective film with respect to side-light emitted from the active layer 120. For example, light emitted from the active layer 120 and directed to the side surface of the light-emitting layer 100 may be reflected by the first electrode 300 and proceed to an inside of the light-emitting layer 100. Accordingly, light extraction efficiency of the LED device 1000 may be increased.

The second electrode 400 is provided on the passivation layer 200 and may be electrically connected to the second semiconductor layer 130. For example, the second electrode 400 may be formed on a portion of the passivation layer 200 located on the upper surface of the light-emitting layer 100. The second electrode 400 may be formed to contact a portion 130a of the upper surface of the second semiconductor layer 130 that is exposed. That is, the second electrode 400 may be formed on the passivation layer 200 so as to contact a portion 130a of the upper surface of the second semiconductor layer 130, that is exposed, without being covered by the passivation layer 200. The second electrode 400 may be a reflective electrode. The second electrode 400 may include a metal material having high conductivity. Accordingly, the second electrode 400 formed on a portion of the passivation layer 200 located on the upper surface of the light-emitting layer 100 may serve as a reflective film with respect to light emitted from the active layer 120. For example, light emitted from the active layer 120 and directed to the upper surface of the light-emitting layer 100 may be reflected by the second electrode 400 and proceed to the inside of the light-emitting layer 100. Accordingly, light extraction efficiency of the LED device 1000 may be increased.

Referring to FIG. 2, when the LED device 1000 is viewed from the top of the light-emitting layer 100, the first electrode 300 may be provided to surround the second electrode 400. Also, the first electrode 300 and the second electrode 400 may be provided to be separated from each other by the passivation layer 200 provided therebetween.

The LED device 1000 may further include the transparent electrode 500 formed to cover the portion 110a of the lower surface of the first semiconductor layer 110 that is exposed. The transparent electrode 500 may be provided on the passivation layer 200 located under the light-emitting layer 100. For example, a central portion of the transparent electrode 500 may be formed to contact the portion 110a of the lower surface of the first semiconductor layer 110 that is exposed by the passivation layer 200. Also, both ends of the transparent electrode 500 may be provided to cover the passivation layer 200 located under the light-emitting layer 100.

The transparent electrode 500 may be electrically connected to the first electrode 300. For example, the transparent electrode 500 may be formed to extend in both side directions of the light-emitting layer 100 to contact the first electrode 300. Alternatively, the first electrode 300 may extend in a vertical direction of the light-emitting layer 100 to contact the transparent electrode 500. When the first semiconductor layer 110 includes an n-type nitride semiconductor, the transparent electrode 500 may be an n-type electrode. The transparent electrode 500 may be formed by depositing a transparent conductive material, such as Indium Tin Oxide (ITO), Indium Zinc Oxide (IZO), etc. on a lower surface of the passivation layer 200 by using, for example, an electron beam deposition method. However, the present embodiment is not limited thereto, and the transparent electrode 500 may be formed, for example, by depositing a metal having high conductivity to be thin on the lower surface of the passivation layer 200.

Referring to FIG. 3, when the LED device 1000 is viewed from a bottom of the light-emitting layer 100, the first electrode 300 may be formed to surround the passivation layer 200. This is because the first electrode 300 is provided on an outer side than the passivation layer 200 in the LED device 1000. The transparent electrode 500 may be provided on the passivation layer 200 located under the light-emitting layer 100. The transparent electrode 500 may be formed to cover the entire bottom surface of the light-emitting layer 100. Furthermore, the transparent electrode 500 may be formed to cover an end of the passivation layer 200 located on a side surface of the light-emitting layer 100. Accordingly, the transparent electrode 500 may be formed to cover the entire bottom surface of the LED device 1000. In FIG. 3, it is illustrated that the transparent electrode 500 is not provided in a region where the transparent electrode 500 and the passivation layer 200 overlap and a region where the transparent electrode 500 and the first electrode 300 overlap. However, for convenience of description, it is considered that the transparent electrode 500 is transparent. Also, the transparent electrode 500 may be formed to cover the entire lower surface of the LED device 1000.

In the LED device 1000 having the structure described above, when a voltage is respectively applied to the first electrode 300 and second electrode 400, light in a predetermined wavelength band is generated by combining electrons and holes in the active layer 120 of the light-emitting layer 100 and is emitted to the outside of the LED device 1000. Here, it may be possible to make the light-emitting layer 100 to emit light in a desired wavelength band by controlling a band gap according to the type of material constituting the light-emitting layer 100. For example, the LED device 1000 may be applied as a pixel of a display apparatus, and may be configured to emit red light, green light, or blue light.

The LED device 1000 described above may include a micro-sized LED device. Specifically, the LED device 1000 may have, for example, a size of approximately 10 μm×10 μm or less, and may have a thickness of approximately 10 μm or less. However, the present embodiment is not limited thereto.

FIGS. 4 to 13 are diagrams for explaining a method of manufacturing the LED device 1100 according to an embodiment.

Referring to FIGS. 4 to 13, a method of manufacturing the LED device 1000 according to an embodiment may include: forming a membrane 30 on a substrate 10; forming a light-emitting layer 600 by sequentially depositing a first semiconductor layer 610 having a three-dimensional shape on the membrane 30, an active layer 620 covering upper and side surfaces of the first semiconductor layer 610, and a second semiconductor layer 630 covering upper and side surfaces of the active layer 620; and forming a first electrode 650 provided on a side of the light-emitting layer 600 and electrically connected to the first semiconductor layer 610 and a second electrode 660 provided on the light-emitting layer 600 and in contact with the second semiconductor layer 630. Hereinafter, a method of manufacturing the LED device 1000 according to an embodiment will be described in detail with reference to FIGS. 4 to 13.

Figure 4:
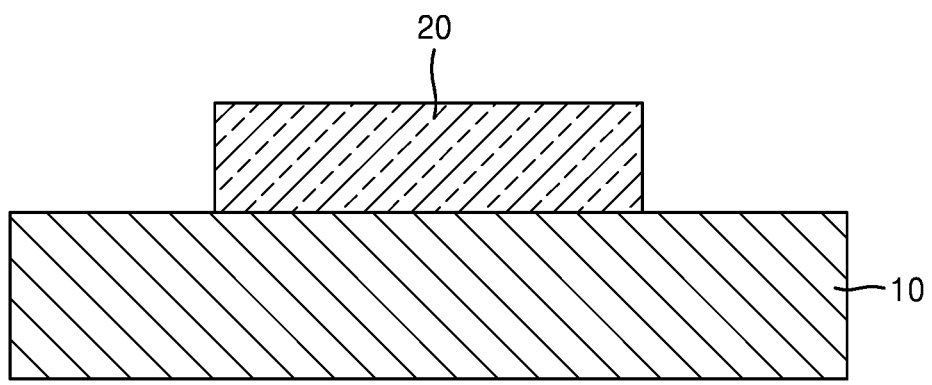
FIG. 4 is a first view for explaining a method of manufacturing an LED device according to an embodiment.

Referring to FIG. 4, a sacrifice layer pattern 20 is formed on an upper surface of a substrate 10. Here, the substrate 10 may include, for example, a sapphire substrate when a light-emitting layer 600 (refer to FIG. 7) described below includes a nitride semiconductor. However, this is only an example, and the substrate 10 may include a silicon substrate, a SiC substrate, a GaAs substrate, etc., and may include various other materials.

The sacrifice layer pattern 20 may include, for example, photoresist, nanoimprint resin, or organic nanoparticles. The sacrifice layer pattern 20 may be formed by using a method, such as a photolithography method, a nano-imprinting method, or attaching organic nanoparticles. The sacrifice layer pattern 20 may be formed in various forms as necessary. For example, the sacrifice layer pattern 20 may be formed in an extending form in one direction, or may be formed in various other forms.

Figure 5:
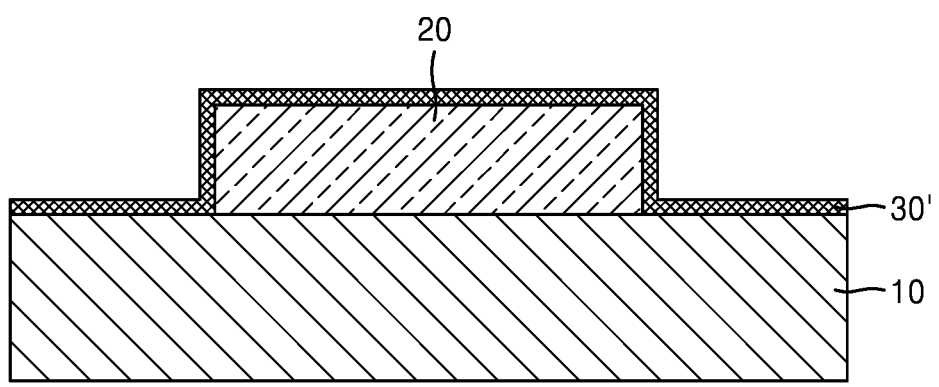
FIG. 5 is a second view for explaining the method of manufacturing the LED device according to the embodiment.

Referring to FIG. 5, a membrane material layer 30' is formed on an upper surface of the substrate 10 to cover the sacrifice layer pattern 20. The membrane material layer 30' may define a cavity 40 (refer to FIG. 6) between the substrate 10 in a subsequent process, and may be formed at a temperature at which the sacrifice layer pattern 20 is not deformed. The membrane material layer 30' may be formed to a thickness capable of stably maintaining the original shape of the structure after the sacrifice layer pattern 20 is removed.

The membrane material layer 30' may be formed by various methods, such as an atomic layer deposition (ALD) method, a wet synthesis method, a metal deposition and oxidation method, a sputtering method, etc. In this case, the membrane material layer 30' may be formed in an amorphous form or a polycrystalline form of fine particles.

The membrane material layer 30' may include, for example, alumina $Al_2O_3$. However, this is an example, and also, the membrane material layer 30' may include silica ($SiO_2$), titania ($TiO_2$), zirconia ($ZrO_2$), yttria ($Y_2O_3$)-zirconia, copper oxide (CuO or $Cu_2O$), and tantalum oxide ($Ta_2O_5$), aluminum nitride (AlN), silicon nitride ($Si_3N_4$), etc. However, the present embodiment is not limited thereto.

Figure 6:
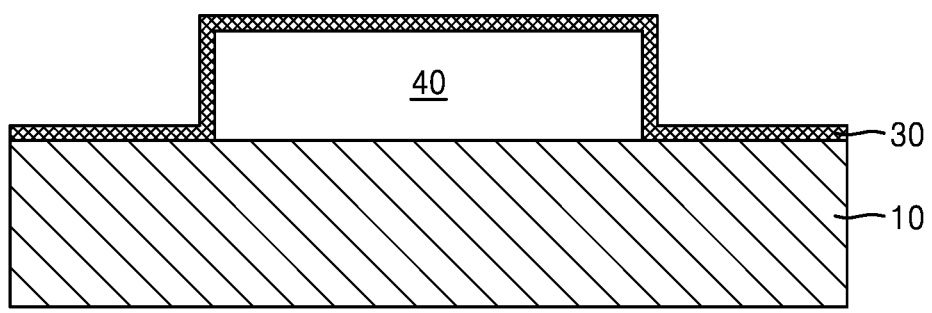
FIG. 6 is a third view for explaining the method of manufacturing the LED device according to the embodiment.

Referring to FIG. 6, the sacrifice layer pattern 20 is selectively removed from the substrate 10. The sacrifice layer pattern 20 may be removed by, for example, heating or ashing or using an organic solvent. When the sacrifice layer pattern 20 is removed, the cavity 40 defined by the substrate 10 and the membrane material layer 30' may be formed.

As described above, the membrane material layer 30' is usually formed in an amorphous form or a polycrystalline form of very small particles. After removing the sacrifice layer pattern 20, the membrane 30 may be formed by crystallizing the membrane material layer 30' through a heat treatment. Leg parts of the membrane 30 are provided to contact the substrate 10 on both sides of the cavity 40.

For example, like a case when the substrate 10 includes a sapphire substrate and the membrane material layer 30' includes alumina, when the substrate 10 and the membrane material layer 30' have the same composition, for example, through a heat treatment at about 1000° C., the membrane material layer 30' may be converted to a membrane 30 (crystallized membrane) having the same crystal structure as the substrate 10. This is because crystallization occurs according to the crystal direction of the substrate 10 while solid phase epitaxy occurs in a portion of the membrane material layer 30' that is in direct contact with the substrate 10 during a high temperature heat treatment.

The membrane 30 formed by the crystallization process may be formed in a polycrystalline or monocrystalline form including large particles. The membrane 30 on the cavity 40 may be crystallized because the membrane 30 acts as a seed layer when a nitride semiconductor epitaxy layer is grown in a subsequent process.

Figure 7:
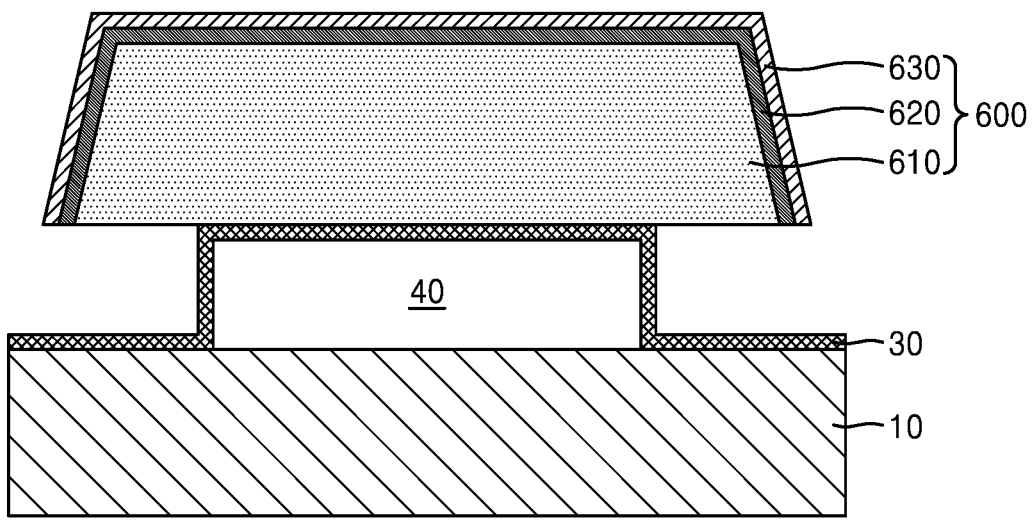
FIG. 7 is a fourth view for explaining the method of manufacturing the LED device according to the embodiment.

Referring to FIG. 7, the light-emitting layer 600 is formed by sequentially growing the first semiconductor layer 610, the active layer 620, and the second semiconductor layer 630 on the membrane 30 on the cavity 40. The substrate 10 and the light-emitting layer 600 are connected by the membrane 30 with the cavity 40 therebetween. The first semiconductor layer 610, the active layer 620, and the second semiconductor layer 630 may be grown by, for example, chemical vapor deposition (CVD). As a specific example, the first semiconductor layer 610, the active layer 620, and the second semiconductor layer 630 may be grown by metal organic chemical vapor deposition (MOCVD).

The light-emitting layer 600 may be formed to have a core-shell structure. In this case, the first semiconductor layer 610 may constitute a core of a core-shell structure, and the active layer 620 and the second semiconductor layer 630 may constitute a shell of the core-shell structure.

The first semiconductor layer 610, the active layer 620, and the second semiconductor layer 630 constituting the light-emitting layer 600 may include, for example, a nitride semiconductor. Here, the nitride semiconductor may include, for example, GaN, InN, AlN, or a combination thereof, but is not limited thereto. In another embodiment, the light-emitting layer 600 may emit light in a desired wavelength band by controlling a band gap according to the type of a material constituting the light-emitting layer 600. For example, the light-emitting layer 600 may emit red light, green light, or blue light.

The first semiconductor layer 610 may be grown on the membrane 30 above the cavity 40. The first semiconductor layer 610 may include, for example, an n-type nitride semiconductor, but is not limited thereto. For example, the first semiconductor layer 610 may include n-GaN. The first semiconductor layer 610 may be formed in a three-dimensional (3D) shape having a relatively large thickness on the membrane 30 above the cavity 40 by controlling a growing time. The first semiconductor layer 610 may have a single layer or multilayer structure.

The active layer 620 may be grown on the first semiconductor layer 610. Here, the active layer 620 may be formed to cover upper and side surfaces of the first semiconductor layer 610. The active layer 620 generates light of a predetermined color by combining electrons with holes, and may have a multi-quantum well (MQW) structure. However, the present embodiment is not limited thereto, and may have a single-quantum well (SQW) structure in some cases. For example, the active layer 620 may include GaN.

The second semiconductor layer 630 may be grown on the active layer 620. The second semiconductor layer 630 may be formed to cover upper and side surfaces of the active layer 620. The second semiconductor layer 630 may include, for example, a p-type nitride semiconductor, but is not limited thereto. For example, the second semiconductor layer 630 may include p-GaN. The second semiconductor layer 630 may have a single layer or multilayer structure.

Stress that may cause a dislocation may be reduced by being distributed to the membrane 30 and the light-emitting layer 600 grown thereon, and also the light-emitting layer 600 grown on the membrane 30 may have high quality and small defect density.

In general, stress caused by a physical difference between a grown substrate and a thin film grown thereon may be converted into elastic energy at an interface and may act as a driving force generating a dislocation. In a normal case, the grown substrate has a thickness significantly greater than that of the thin film, so it is difficult to deform, and thus, the stress is released as a dislocation is generated in the thin film. At this time, when the thin film is grown to a predetermined thickness or more, a dislocation at an interface begins as elastic energy at the interface becomes greater than dislocation generation energy. However, when the membrane 30 has a thickness less than that of the light-emitting layer 600 as in the present embodiment, the generation of a dislocation in the light-emitting layer 600 is reduced, and thus, a high-quality light-emitting layer 600 with a low defect density may be formed.

In addition, in the present embodiment, since the cavity 40 exists between the substrate 10 and the light-emitting layer 600, even if there is a difference in thermal expansion coefficient between the substrate 10 and the light-emitting layer 600, the cavity 40 may absorb stress energy caused by deformation, and thus, thermal stress being applied to the light-emitting layer 600 may be reduced and a bending phenomenon of the substrate 10 may also be reduced.

As described above, a light-emitting layer 600 having excellent physical properties may be formed on the membrane 30 above the cavity 40, and accordingly, an LED device 1100 (refer to FIG. 14) having high efficiency, high reliability, and high quality that may increase light extraction efficiency may be implemented.

Figure 8:
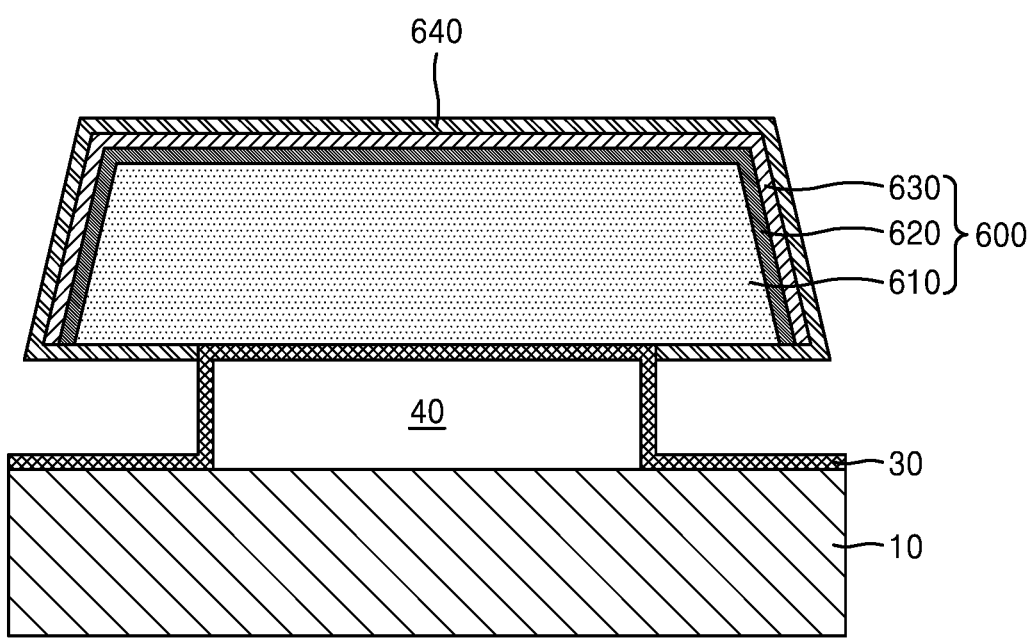
FIG. 8 is a fifth view for explaining the method of manufacturing the LED device according to the embodiment.
Figure 9:
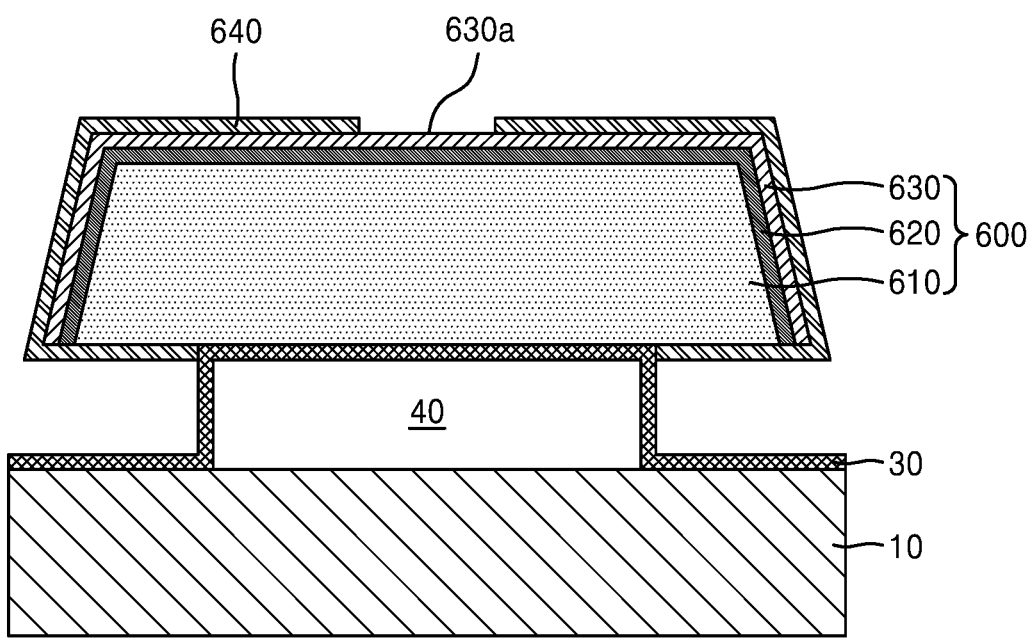
FIG. 9 is a sixth view for explaining the method of manufacturing the LED device according to the embodiment.

Referring to FIG. 8, a passivation layer 640 is formed on a surface of the light-emitting layer 600. Here, the passivation layer 640 may be formed to cover upper and side surfaces of the second semiconductor layer 630. Also, the passivation layer 640 may be formed to cover a part of a lower surface of the first semiconductor layer 610. The passivation layer 640 may be formed by depositing, for example, silicon oxide or silicon nitride on a surface of the light-emitting layer 600 by using, for example, an atomic layer deposition (ALD) method or a chemical vapor deposition method. Referring to FIG. 9, a portion 630*a* of the upper surface of the second semiconductor layer 630 is exposed by etching an upper surface of the passivation layer 640.

Figure 10:
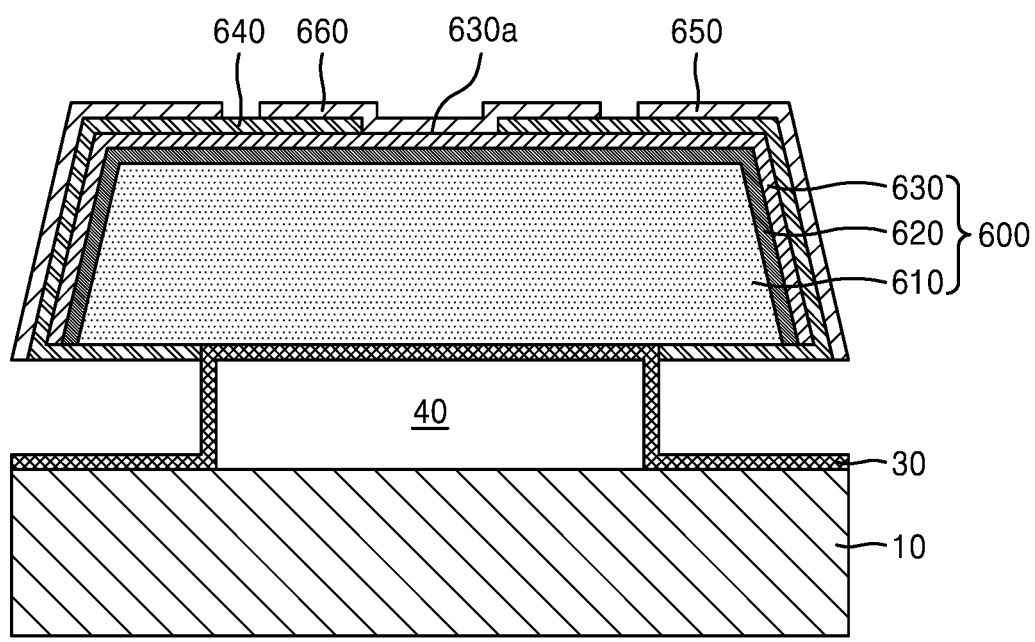
FIG. 10 is a seventh view for explaining the method of manufacturing the LED device according to the embodiment.

Referring to FIG. 10, a first electrode 650 and a second electrode 660 are formed on the passivation layer 640 through patterning. The first electrode 650 may be formed on a portion of the passivation layer 640 located on a side surface of the light-emitting layer 600, and the second electrode 660 may be formed on a portion of the passivation layer 640 located on the upper surface of the light-emitting layer 600 so as to contact the portion 630*a* of the second semiconductor layer 630 exposed by the passivation layer 640. For example, after depositing a metal layer on the passivation layer 640, a first electrode 650 covering side surfaces of the passivation layer 640 and a second electrode 660 that is in contact with the portion 630*a* of the upper surface of the second semiconductor layer 630 are formed by patterning the metal layer. The first electrode 650 may be formed to extend on a portion of the passivation layer 640 located on the upper surface of the light-emitting layer 600. Accordingly, the first electrode 650 may have a curved shape to simultaneously cover the upper and side surfaces of the light-emitting layer 600. As described below, the first electrode 650 may be electrically connected to the first semiconductor layer 610 through a transparent electrode 690 (refer to FIG. 13). Here, the first electrode 650 and the second electrode 660 may be reflective electrodes. When the first semiconductor layer 610 includes an n-type nitride semiconductor, the first electrode 650 may be an n-type electrode. When the second semiconductor layer 630 includes a p-type nitride semiconductor, the second electrode 660 may be a p-type electrode. The first electrode 650 and the second electrode 660 may be formed by depositing a metal material having high conductivity on an upper surface of the passivation layer 640 by using, for example, an electron beam deposition method, etc. Alternatively, the first electrode 650 and the second electrode 660 may be formed through a lift-off method.

Figure 11:
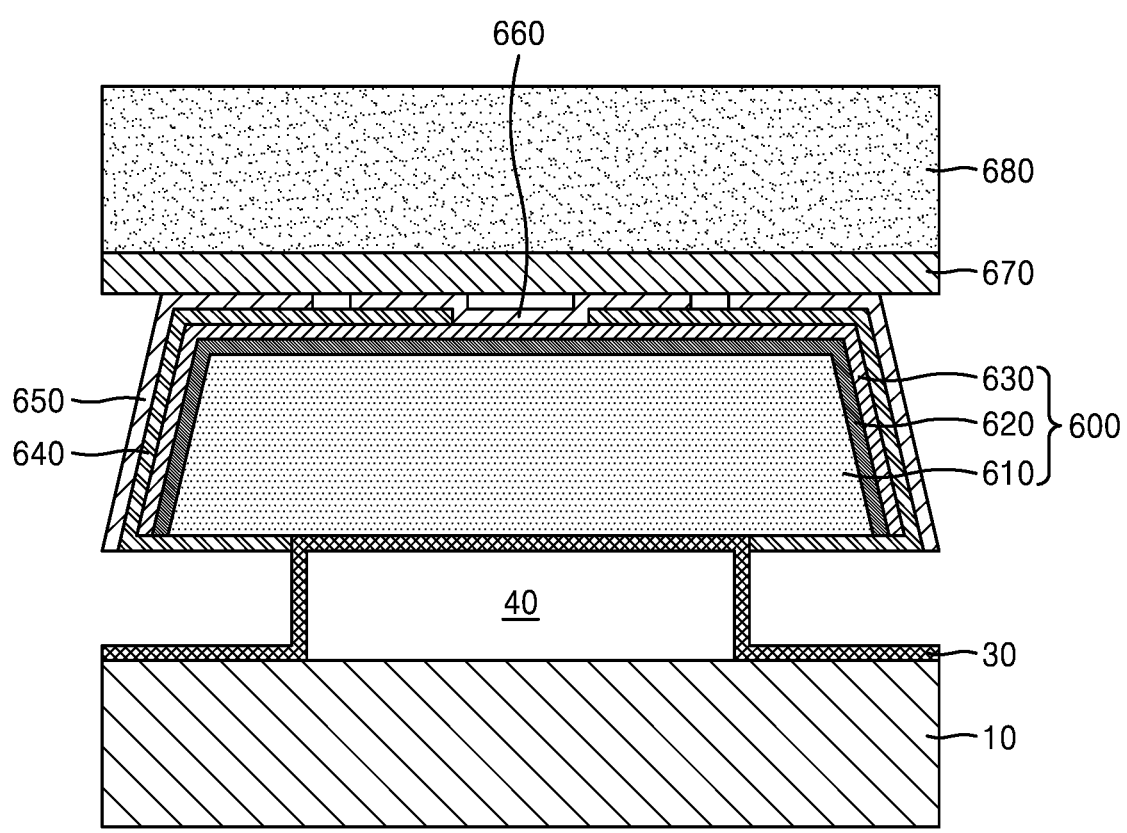
FIG. 11 is an eighth view for explaining the method of manufacturing the LED device according to the embodiment.
Figure 12:
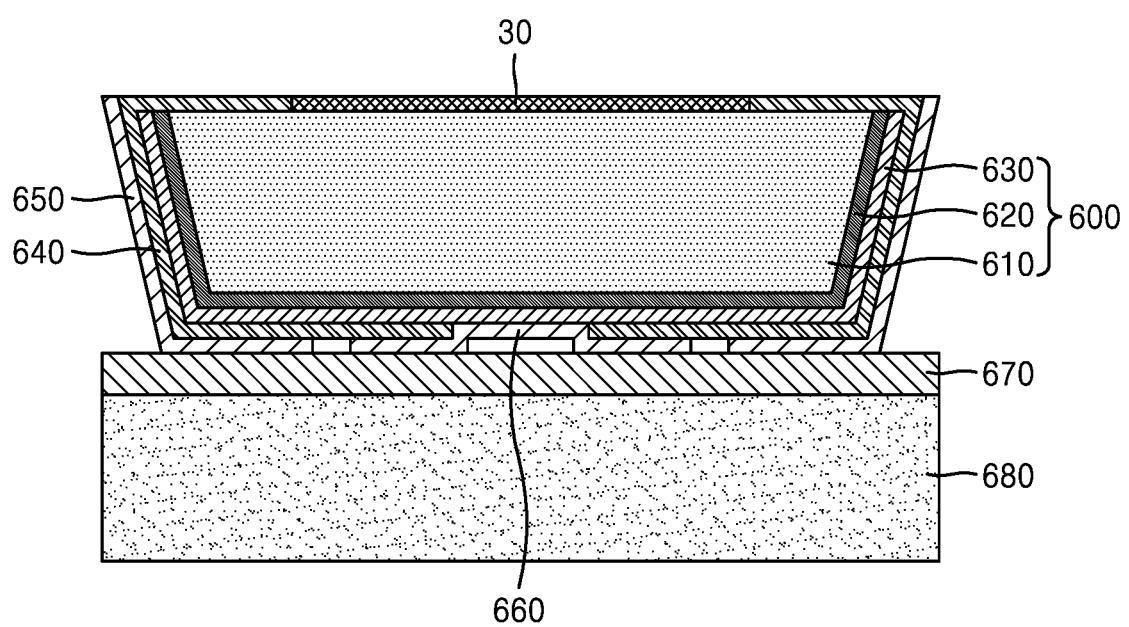
FIG. 12 is a ninth view for explaining the method of manufacturing the LED device according to the embodiment.

Referring to FIG. 11, an adhesive layer 670 of a separation member 680 is attached to the first electrode 650 and the second electrode 660 formed on a portion the passivation layer 640 located on the upper surface of the light-emitting layer 600. Next, referring to FIG. 12, the light-emitting layer 600 is separated from the substrate 10 by demolishing the leg parts of the membrane 30 by applying a mechanical force to the separation member 680. In this case, as shown in FIG. 12, the membrane 30 on the surface of the first semiconductor layer 610 remains.

Referring to FIG. 11, the substrate 10 and the light-emitting layer 600 are connected by the membrane 30 with the cavity 40 therebetween. Here, since the leg parts of the membrane 30 may collapse even with a small mechanical force, the light-emitting layer 600 may be easily separated from the substrate 10 without damaging the light-emitting layer 600.

Figure 13:
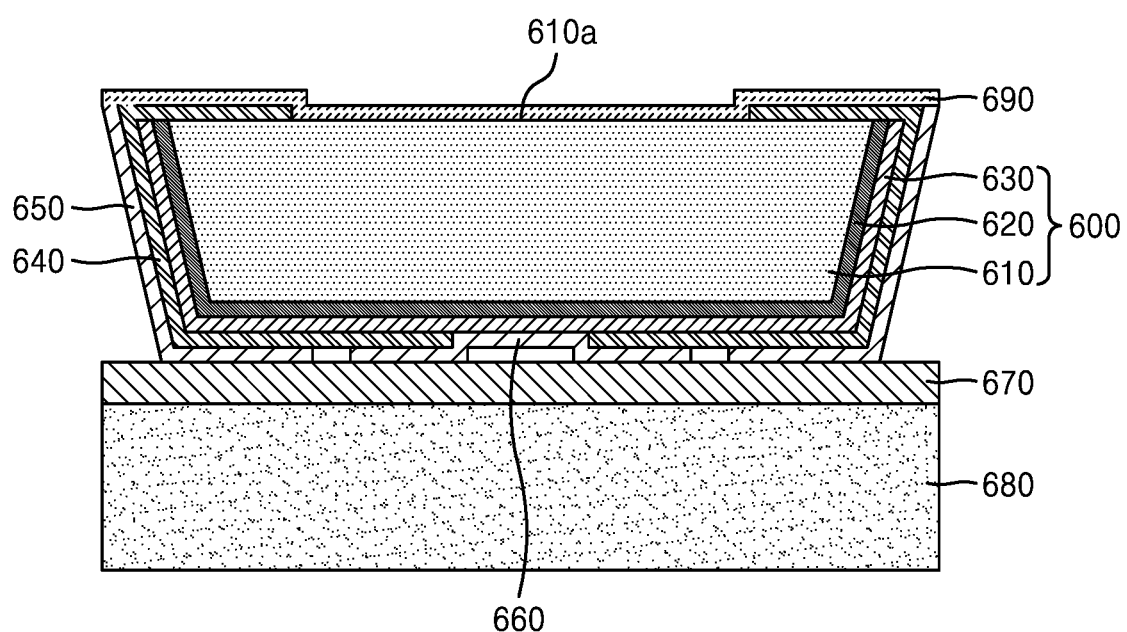
FIG. 13 is a tenth view for explaining the method of manufacturing the LED device according to the embodiment.

Referring to FIG. 13, the membrane 30 remained on the surface of the first semiconductor layer 610 is removed. For example, if the membrane 30 contains alumina, the membrane 30 may be removed by phosphoric acid $H_3PO_4$, but this is only an example. As the membrane 30 is removed, a portion 610a of the surface of the first semiconductor layer 610 is exposed. The transparent electrode 690 is formed on the passivation layer 640 so as to contact the portion 610a of the surface of the first semiconductor layer 610 that is exposed. The transparent electrode 690 may be electrically connected to the first electrode 650. For example, the transparent electrode 690 may be formed to extend in both side directions of the light-emitting layer 600 to contact the first electrode 650. When the first semiconductor layer 610 includes an n-type nitride semiconductor, the transparent electrode 690 may be an n-type electrode. The transparent electrode 690 may be formed by depositing a transparent conductive material, such as Indium Tin Oxide (ITO), Indium Zinc Oxide (IZO), etc. on the passivation layer 640 by using, for example, an electron beam deposition method. However, the present embodiment is not limited thereto, and the transparent electrode 690 may be formed, for example, by depositing a metal having high conductivity to be thin on the passivation layer 640.

Figure 14:
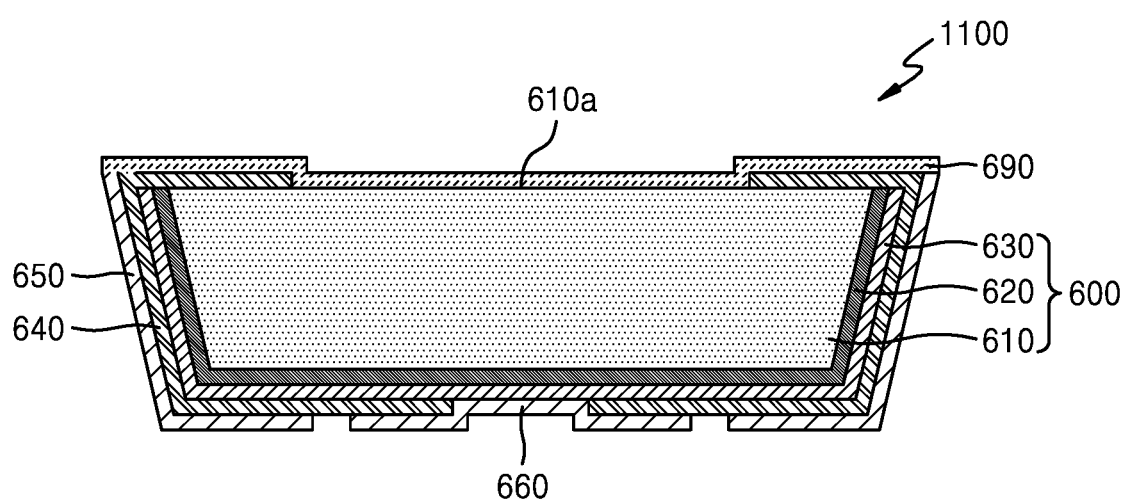
FIG. 14 is an eleventh view for explaining the method of manufacturing the LED device according to the embodiment.

Referring to FIG. 14, the separation member 680 together with the adhesive layer 670 may be detached from the first electrode 650 and the second electrode 660. Accordingly, the manufacturing of the LED device 1100 may be completed. The LED device 1100 manufactured as described above may have a size of, for example, approximately 10 μm×10 μm or less, and may have a thickness of approximately 10 μm or less. However, this is merely an example.

According to the present embodiment, the light-emitting layer 600 is grown on the membrane 30 separated from the substrate 10 with the cavity 40 therebetween, and thus, the LED device 1100 having high-quality with a low defect density may be manufactured. Also, since the light-emitting layer 600 may be easily separated from the substrate 10 without damaging the light-emitting layer 600 even with a small mechanical force, it is very suitable for applications requiring separation of the substrate 10 and the light-emitting layer 600. In addition, the exposed end of the active layer 620 on a light extraction surface of the light-emitting layer 600 is covered by the passivation layer 640, and thus, the light extraction efficiency may further be increased.

Figure 15:
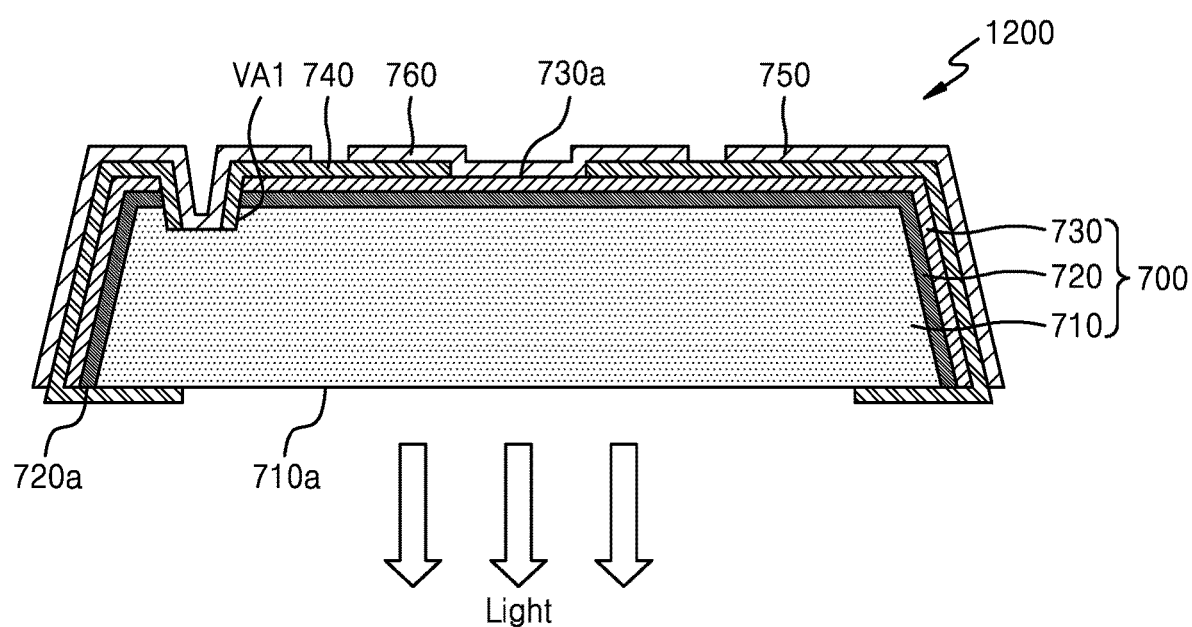
FIG. 15 is a schematic side cross-sectional view of an LED device according to another embodiment.
Figure 16:
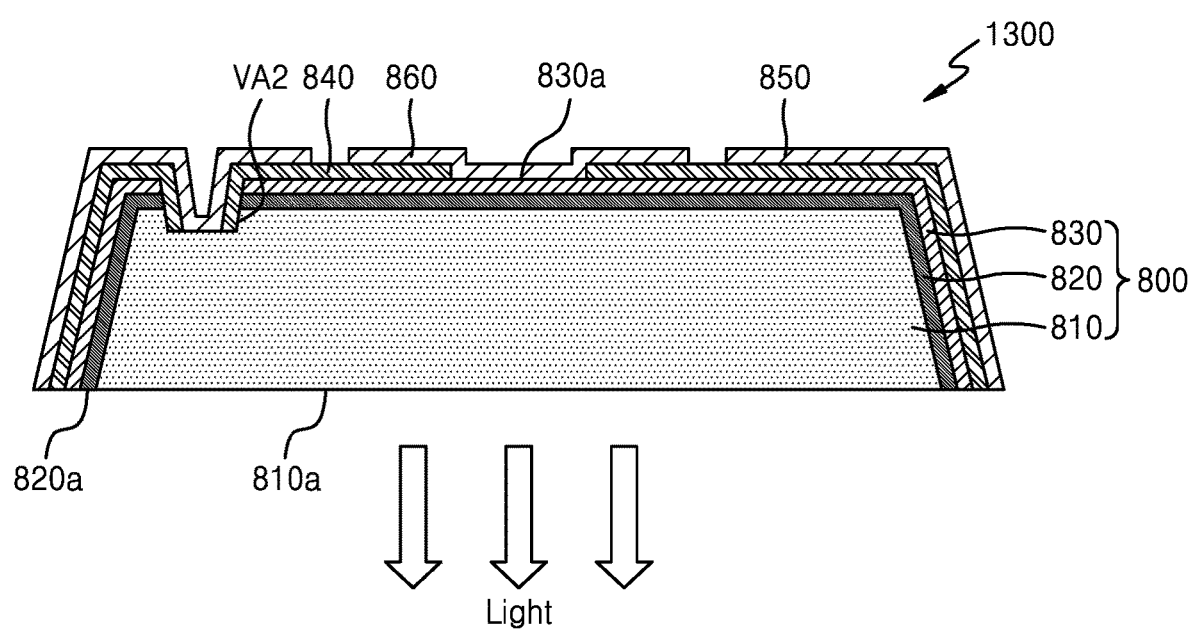
FIG. 16 is a schematic side cross-sectional view of an LED device according to another embodiment.

FIG. 15 is a schematic side cross-sectional view of an LED device 1200 according to another embodiment. The LED device 1200 of FIG. 15 may be substantially the same as the LED device 1000 of FIG. 1 except that LED device 1200 includes a via hole VA1 and does not include the transparent electrode 500. In describing the LED device 1200 of FIG. 15, descriptions already given with reference to FIGS. 1 to 3 will be omitted. FIG. 16 is a schematic side cross-sectional view of an LED device 1300 according to another embodiment. The LED device 1300 of FIG. 16 may be substantially the same as the LED device 1200 of FIG. 15 except that a passivation layer 840 does not cover a lower surface of the light-emitting layer 800. In describing the LED device 1300 of FIG. 15, descriptions already given with reference to FIG. 15 will be omitted.

Referring to FIG. 15, the LED device 1200 may include: a light-emitting layer 700 having a core-shell structure and including a first semiconductor layer 710, an active layer 720, and a second semiconductor layer 730; a passivation layer 740 formed to cover at least a portion of a side surface and an upper surface of the second semiconductor layer 730; a first electrode 750 provided on a portion of the passivation layer 740 located on a side of the light-emitting layer 700, electrically connected to the first semiconductor layer 710, and including a reflective material; and a second electrode 760 formed on a portion of the passivation layer 740 located on an upper surface of the light-emitting layer 700 and in contact with a portion 730a of an upper surface of the second semiconductor layer 730 that is exposed.

The light-emitting layer 700 may have a core-shell structure. The light-emitting layer 700 of FIG. 15 may have a core-shell structure in which a portion 710a of a core (e.g., a lower surface of the core) is not covered by a shell but is exposed. In this case, light may be emitted from a part of the core exposed by the shell. The light-emitting layer 700 may include the first semiconductor layer 710, the active layer 720, and the second semiconductor layer 730.

The first semiconductor layer 710 corresponds to the core of the core-shell structure and may have a 3D shape having a relatively smaller thickness than the active layer 720 and the second semiconductor layer 730.

The active layer 720 and the second semiconductor layer 730 correspond to a shell of the core-shell structure, and may have a relatively smaller thickness than the first semiconductor layer 710. The active layer 720 may be formed to cover upper and side surfaces of the first semiconductor layer 710 having a 3D shape, and the second semiconductor layer 730 may be formed to cover upper and side surfaces of the active layer 720. Accordingly, the lower surface of the first semiconductor layer 710 may be exposed without being covered by the active layer 720 and the second semiconductor layer 730. The exposed surface of the first semiconductor layer 710 may be a surface from which light emitted from the active layer 720 is emitted.

A via hole VA1 may be formed in the light-emitting layer 700. For example, the via hole VA1 that exposes a portion of the upper surface of the first semiconductor layer 710 to the outside of the light-emitting layer 700 may be formed in the light-emitting layer 700. As described below, the first semiconductor layer 710 and the first electrode 750 provided on the passivation layer 740 may contact each other by the via hole VA1.

The passivation layer 740 is provided on the light-emitting layer 700. The passivation layer 740 may be formed to cover the surface of the light-emitting layer 700 except for the portion 710a of the lower surface of the first semiconductor layer 710 and a portion 730a of the upper surface of the second semiconductor layer 730. The passivation layer 740 may be formed to cover the entire side surfaces of the light-emitting layer 700. Accordingly, the passivation layer 740 may be formed to cover ends 720a of the active layer 720 exposed on the lower surface of the light-emitting layer 700. Accordingly, light that may emit from the ends 720a of the active layer 720 may be blocked, and thus, light extraction efficiency may be increased. Also, the passivation layer 740 may be formed to cover side surfaces of the via hole VA1. Accordingly, the passivation layer 740 may be provided to cover the ends of the active layer 720 and ends of the second semiconductor layer 730 exposed by the via hole VA1. Referring to FIG. 16, the passivation layer 840 may not cover a lower surface 810a of a first semiconductor layer 810. Accordingly, the entire lower surface 810a of the first semiconductor layer 810 may be exposed to the outside.

The first electrode 750 is provided on the passivation layer 740 and may be electrically connected to the first semiconductor layer 710. For example, the first electrode 750 may be provided on a portion of the passivation layer 740 located on a side of the light-emitting layer 700. Also, the first electrode 750 may be formed to extend to a portion of the passivation layer 740 located on the upper surface of the light-emitting layer 700. Accordingly, the first electrode 750 may also be formed on a portion of the upper surface of the light-emitting layer 700. A portion of the first electrode 750 may be provided in the via hole VA1. For example, the first electrode 750 formed on the upper surface of the passivation layer 740 may be provided in the via hole VA1. That is, the via hole VA1 may be formed in a region of the light-emitting layer 700 corresponding to the first electrode 750. Accordingly, a portion of the first semiconductor layer 710 exposed by the via hole VA1 and the first electrode 750 provided on the passivation layer 740 located above the light-emitting layer 700 may contact each other. The first electrode 750 may be a reflective electrode.

In addition, as described above, the first electrode 750 may be provided on the passivation layer 740, and the passivation layer 740 may be formed to cover the side surfaces of the via hole VA1. Accordingly, the first electrode 750 may be provided to be separated from an end of the active layer 720 and an end of the second semiconductor layer 730 exposed by the via hole VA1 from each other with the passivation layer 740 therebetween.

The second electrode 760 is provided on the passivation layer 740 and may be electrically connected to the second semiconductor layer 730. For example, the second electrode 760 may be formed on a portion of the passivation layer 740 located on the upper surface of the light-emitting layer 700. The second electrode 760 may be formed to contact a portion 730*a* of the exposed upper surface of the second semiconductor layer 730.

As discussed above, the LED device 1300 of FIG. 16 may be substantially the same as the LED device 1200 of FIG. 15 except that a passivation layer 840 does not cover a lower surface of the light-emitting layer 800. Accordingly, further descriptions of features such as, for example, the active layer 820, ends 820*a* of the active layer 820, the second semiconductor layer 130, a portion 830*a* of the second semiconductor layer 130, the first electrode 850, the second electrode 860, and the via hole VA2 are omitted.

FIGS. 17 to 26 are diagrams for explaining a method of manufacturing an LED device according to another embodiment.

Figure 17:
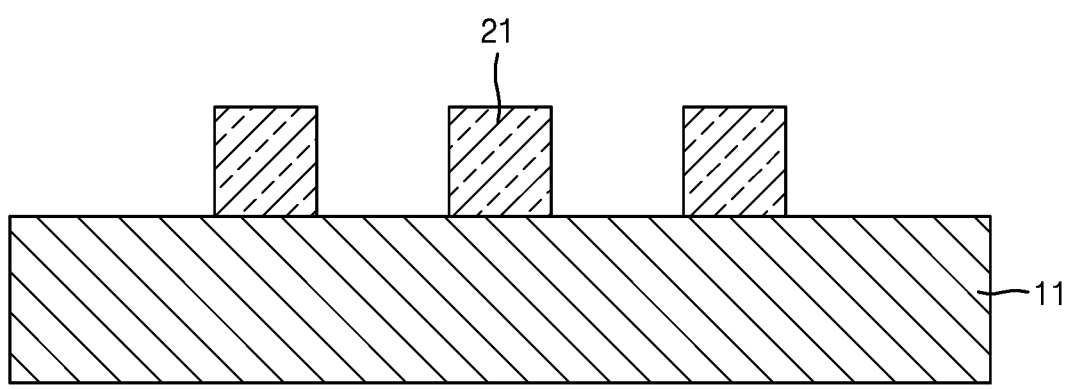
FIG. 17 is a first view for explaining a method of manufacturing an LED device according to another embodiment.

Referring to FIG. 17, a plurality of sacrifice layer patterns 21 are formed on the upper surface of a substrate 11. In FIG. 17, a case that three sacrifice layer patterns 21 are formed on an upper surface of the substrate 11 is depicted as an example. Here, the substrate 11 may include, for example, a sapphire substrate when a light-emitting layer 900 (refer to FIG. 20) to be described below includes a nitride semiconductor, but is not limited thereto. The plurality of sacrifice layer patterns 21 may be formed in various shapes by using, for example, a photolithography method, a nano-imprinting method, or attaching organic nanoparticles, etc.

Figure 18:
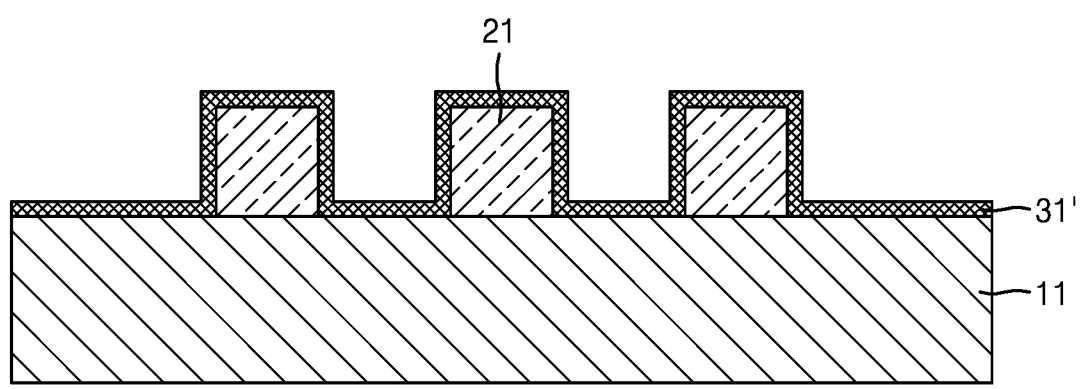
FIG. 18 is a third view for explaining the method of manufacturing the LED device according to the another embodiment.

Referring to FIG. 18, a membrane material layer 31' is formed on the upper surface of the substrate 11 to cover the plurality of sacrifice layer patterns 21. The membrane material layer 31' may be formed by using a method, such as an atomic layer deposition (ALD) method, a wet synthesis method, a metal thin film formation method, an oxidation process, a sputtering method, etc. In this case, the membrane material layer 31' may be formed in an amorphous form or a polycrystalline form of fine particles. For example, when the substrate 11 includes a sapphire substrate, the membrane material layer 31' may include alumina $Al_2O_3$.

Figure 19:
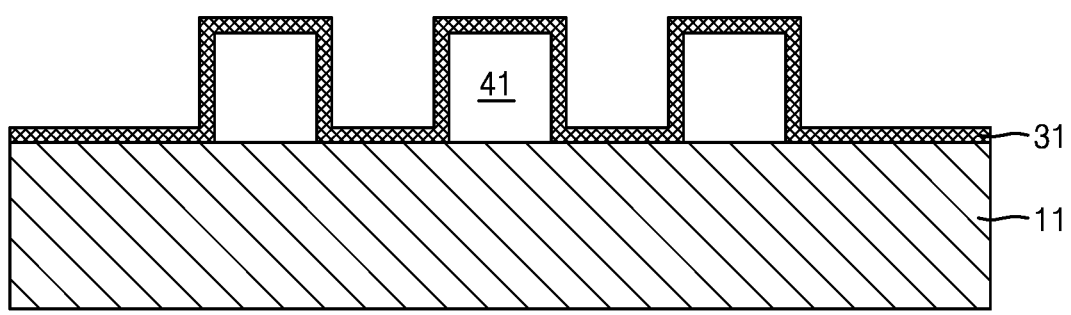
FIG. 19 is a fourth view for explaining the method of manufacturing the LED device according to the another embodiment.

Referring to FIG. 19, a plurality of sacrifice layer patterns 21 are selectively removed from the substrate 11. In this manner, when the plurality of sacrifice layer patterns 21 are removed, a plurality of cavities 41 defined by the substrate 11 and the membrane material layer 31' may be formed.

After the plurality of sacrifice layer patterns 21 are removed, a membrane 31 surrounding the plurality of cavities 41 may be formed by crystallizing the membrane material layer 31' through heat treatment. In FIG. 19, as an example, a case of forming the three cavities 41 and a membrane 31 surrounding the three cavities 41 corresponding to the three sacrifice layer patterns 21 are depicted. The membrane 31 formed by the crystallization process may be formed in a polycrystalline form or a single crystal form including large particles. On both sides of each of the plurality of cavities 41, leg parts of the membrane 31 are provided to contact the substrate 11.

Figure 20:
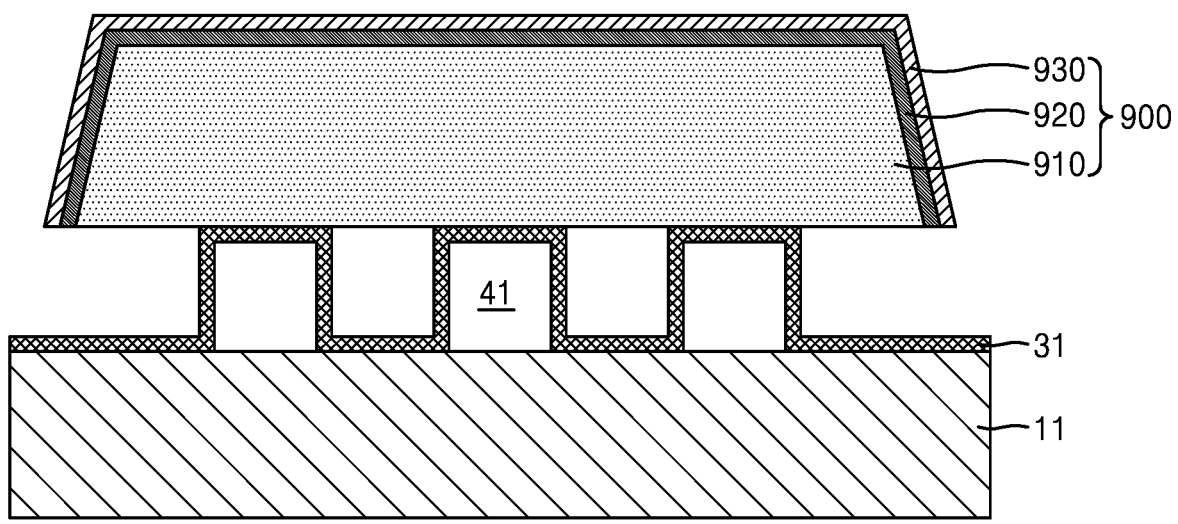
FIG. 20 is a fifth view for explaining the method of manufacturing the LED device according to the another embodiment.

Referring to FIG. 20, the light-emitting layer 900 layer is formed by sequentially growing a first semiconductor layer 910, an active layer 920, and a second semiconductor layer 930 on the membrane 31 on the plurality of cavities 41. Here, for example, the first semiconductor layer 910, the active layer 920, and the second semiconductor layer 930 may be grown by using an metal organic chemical vapor deposition (MOCVD) method, but the present embodiment is not limited thereto.

The light-emitting layer 900 may be formed to have a core-shell structure. In this case, the first semiconductor layer 910 may constitute a core of the core-shell structure, and the active layer 920 and the second semiconductor layer 930 may constitute a shell of the core-shell structure. The first semiconductor layer 910, the active layer 920 and the second semiconductor layer 930 constituting the light-emitting layer 900 may include, for example, a nitride semiconductor. It may be possible to make the light-emitting layer 900 to emit light in a desired wavelength band by controlling a band gap according to the type of material constituting the light-emitting layer 900.

The first semiconductor layer 910 may be grown on the membrane 31 above the plurality of cavities 41. Here, when a growing time is controlled, nitride semiconductors are respectively grown on the membrane 31 and may be connected to each other, and thus, the first semiconductor layer 910 may be formed. The first semiconductor layer 910 may have a 3D shape by being formed with a relatively large thickness. The first semiconductor layer 910 may include, for example, an n-type nitride semiconductor, but is not limited thereto.

The active layer 920 may be grown on the first semiconductor layer 910. Here, the active layer 920 may be formed to cover upper and side surfaces of the first semiconductor layer 910. The second semiconductor layer 930 may be grown on the active layer 920. The second semiconductor layer 930 may include, for example, a p-type nitride semiconductor, but is not limited thereto.

As described above, since the membrane 31 may release stress that may cause a dislocation by dividing the stress with the light-emitting layer 900 grown thereon, the light-emitting layer 900 grown on the membrane 31 may have high quality with a small defect density. In addition, since the plurality of cavities 41 are present between the substrate 11 and the light-emitting layer 900, thermal stress being applied to the light-emitting layer 900 may be reduced.

Figure 21:
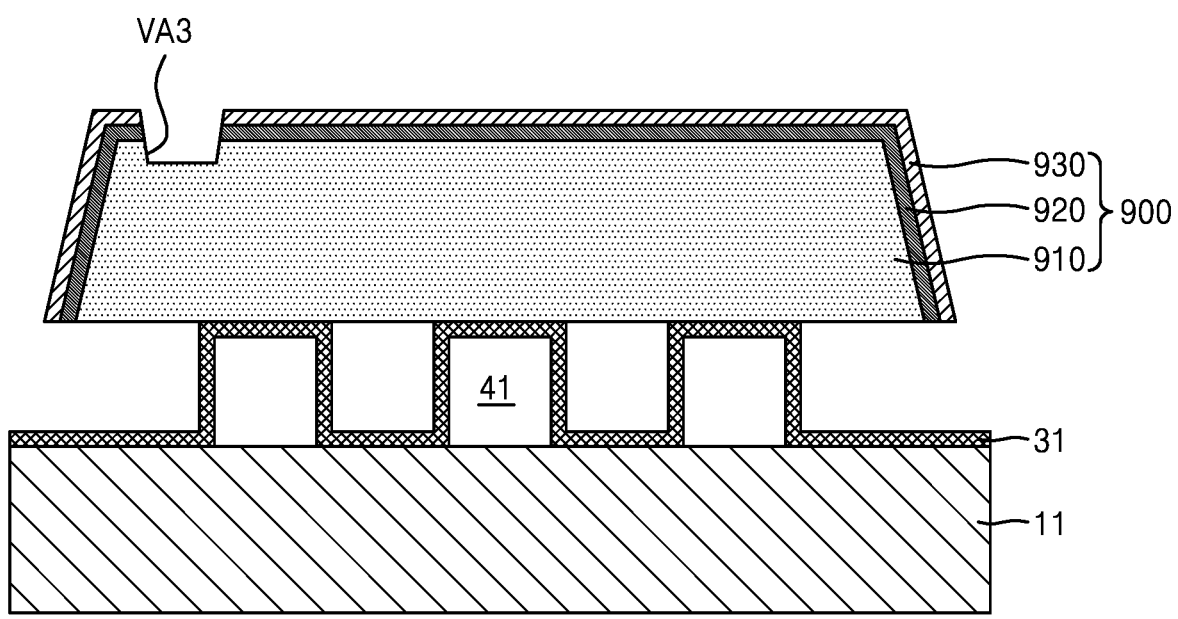
FIG. 21 is a sixth view for explaining the method of manufacturing the LED device according to the another embodiment.

Referring to FIG. 21, a via hole VA3 is formed in the light-emitting layer 900. For example, the via hole VA3 that exposes a portion of the upper surface of the first semiconductor layer 910 to the outside of the light-emitting layer 900 may be formed in the light-emitting layer 900. Also, in a region where the via hole VA3 is formed, cross section of the active layer 920 and the second semiconductor layer 930 may be exposed by the via hole VA3. Accordingly, ends of the active layer 920 and the second semiconductor layer 930 may be exposed to the outside of the light-emitting layer 900 in the region where the via hole VA3 is formed.

Figure 22:
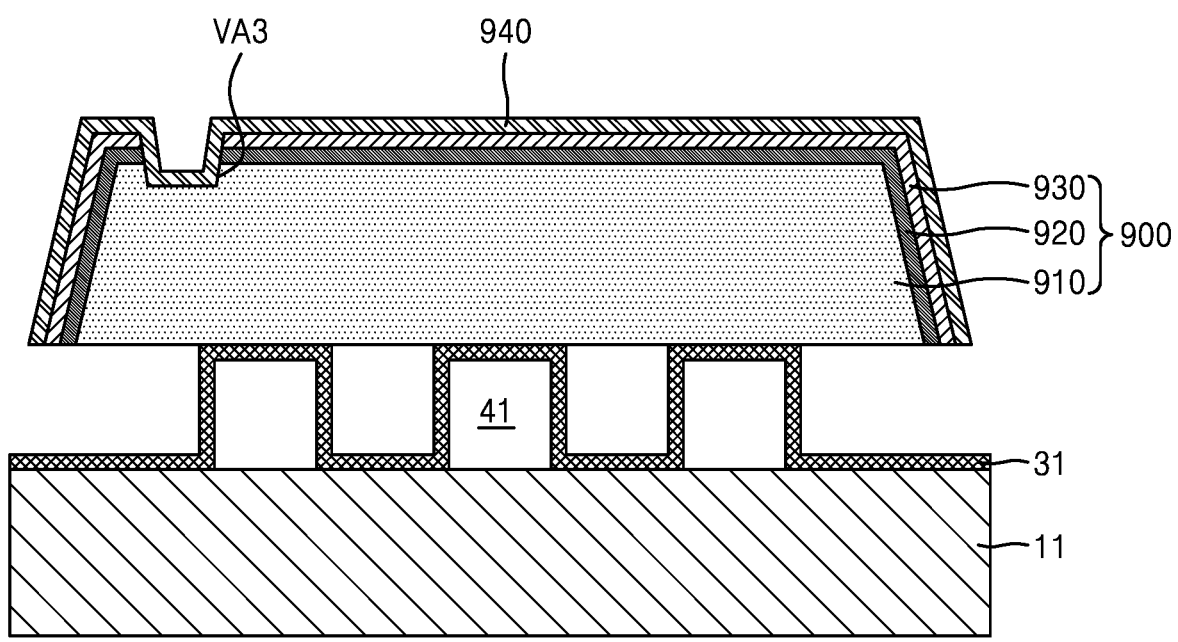
FIG. 22 is a seventh view for explaining the method of manufacturing the LED device according to the another embodiment.
Figure 23:
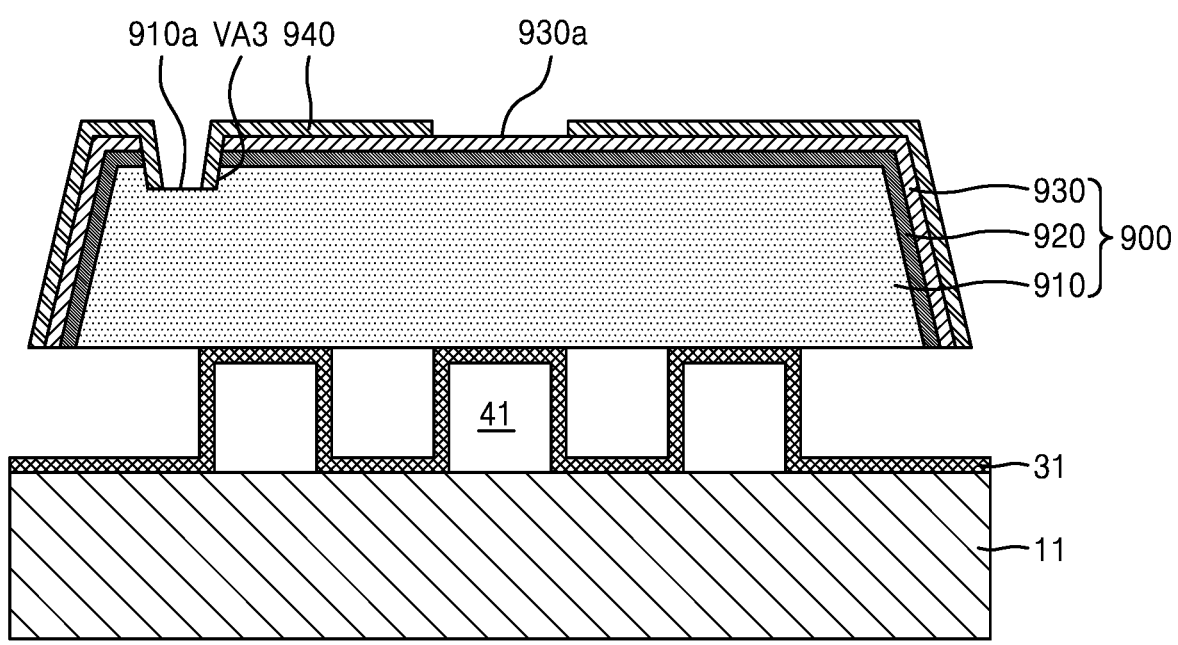
FIG. 23 is an eighth view for explaining the method of manufacturing the LED device according to the another embodiment.

Referring to FIG. 22, a passivation layer 940 is formed on a surface of the light-emitting layer 900. The passivation layer 940 may be formed to cover upper and side surfaces of the second semiconductor layer 930. The passivation layer 940 may be formed, for example, by using an atomic layer deposition (ALD) method or a chemical vapor deposition method. The passivation layer 940 may be formed so as not to cover a lower surface of the light-emitting layer 900. However, the present embodiment is not limited thereto, and the passivation layer 940 may be formed to cover the lower surface of the light-emitting layer 900 according to the deposition method. Also, the passivation layer 940 may not be formed on a lower surface of the first semiconductor layer 910 between leg parts of the membrane 31. However, the present embodiment is not limited thereto, and the passivation layer 940 may also be formed on the lower surface of the first semiconductor layer 910 between leg parts of the membrane 31 according to the deposition method. A portion of the passivation layer 940 may be formed in the via hole VA3. Accordingly, the passivation layer 940 may be formed to cover the ends of the active layer 920 and the second semiconductor layer 930 exposed by the via hole VA3. Next, referring to FIG. 23, a portion 930a of an upper surface of the second semiconductor layer 930 is exposed by etching a portion of an upper surface of the passivation layer 940. Also, a portion 910a of the upper surface of the first semiconductor layer 910 formed in the via hole VA3 is exposed by etching another portion of the upper surface of the passivation layer 940.

Figure 24:
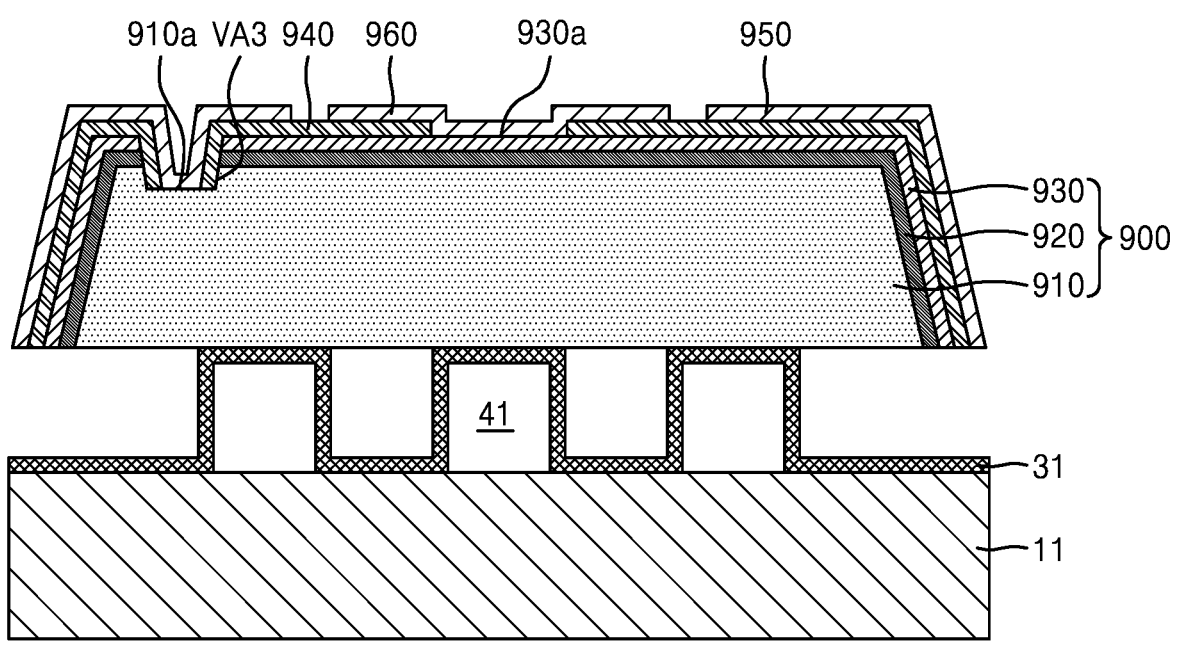
FIG. 24 is a ninth view for explaining the method of manufacturing the LED device according to the another embodiment.

Referring to FIG. 24, a first electrode 950 and a second electrode 960 are formed on the passivation layer 940 through patterning. For example, after depositing a metal layer on the passivation layer 940, the first electrode 950 covering at least a portion of side and upper surfaces of the passivation layer 940 and a second electrode 960 that contacts a portion 930a of an upper surface of the second semiconductor layer 930 are formed by patterning the metal layer. The first electrode 950 may be formed to extend to a portion of the passivation layer 940 located on the upper surface of the light-emitting layer 900. Accordingly, the first electrode 950 may have a curved shape to simultaneously cover at least a portion of the side surface and the upper surface of the light-emitting layer 900. A portion of the first electrode 950 may be formed in the via hole VA3. Accordingly, the first electrode 950 may contact a portion 910a of the first semiconductor layer 910 exposed by the via hole VA3. Here, the first electrode 950 and the second electrode 960 may be reflective electrodes. When the first semiconductor layer 910 includes an n-type nitride semiconductor, the first electrode 950 may be an n-type electrode. When the second semiconductor layer 930 includes a p-type nitride semiconductor, the second electrode 960 may be a p-type electrode. The first electrode 950 and the second electrode 960 may be formed by depositing a metal material having high conductivity on the upper surface of the passivation layer 940 by using, for example, an electron beam deposition method. Alternatively, the first electrode 950 and the second electrode 960 may be formed through a lift-off method.

Figure 25:
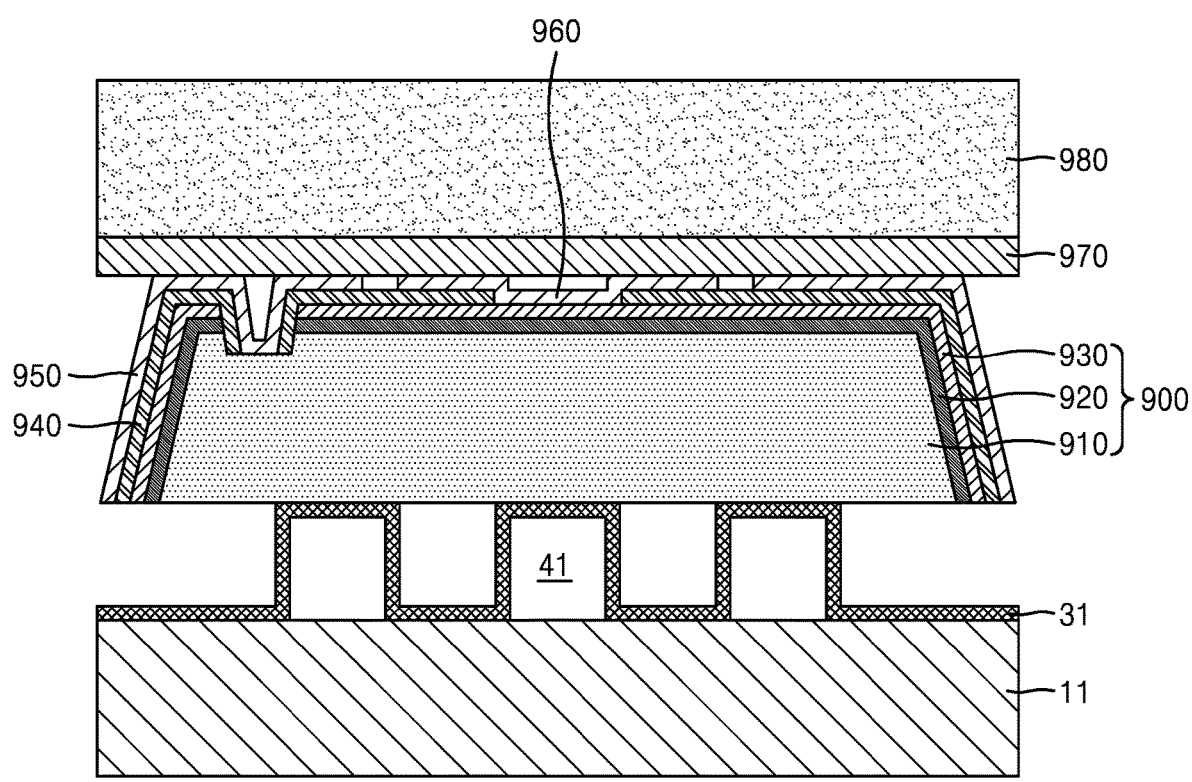
FIG. 25 is a tenth view for explaining the method of manufacturing the LED device according to the another embodiment.

Referring to FIG. 25, an adhesive layer 970 of a separation member 980 is attached to the first electrode 950 and the second electrode 960 provided on the passivation layer 940 positioned on the top surface of the light-emitting layer 900.

Figure 26:
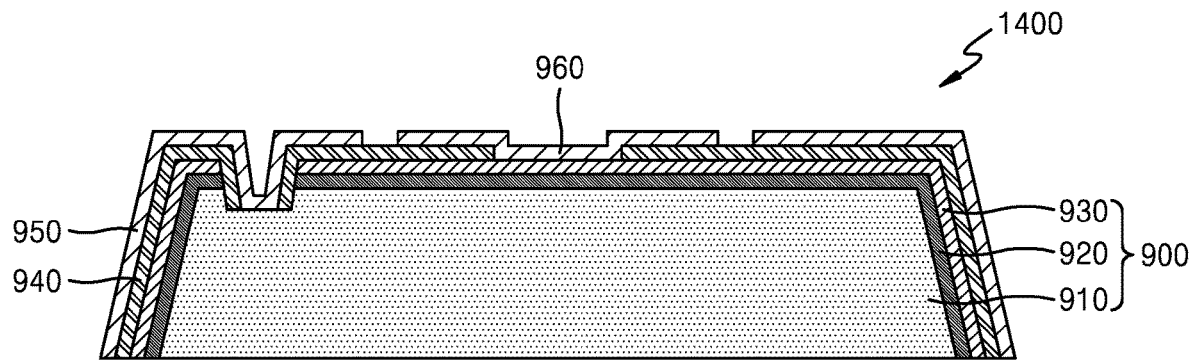
FIG. 26 is an eleventh view for explaining the method of manufacturing the LED device according to the another embodiment.

Next, referring to FIG. 26, the light-emitting layer 900 is separated from the substrate 11 by demolishing the leg parts of the membrane 31 by applying a mechanical force to the separation member 980.

The substrate 11 and the light-emitting layer 900 are connected to each other by the membrane 31 with a plurality of cavities 41 therebetween. Here, since the leg parts of the membrane 31 may collapse even with a small mechanical force, the light-emitting layer 900 may be easily separated from the substrate 11 without damaging the light-emitting layer 900.

Referring to FIG. 26, the separation member 980 may be detached from the first electrode 950 and the second electrode 960. Accordingly, the manufacturing of an LED device 1400 may be completed. In the present embodiment, since the light-emitting layer 900 is grown by using the membrane 31 that surrounds the plurality of cavities 41, the LED device 1400 of a greater size than the LED device 1100 manufactured according to the previous embodiment may be manufactured. For example, the LED device 1400 may have, for example, a size of approximately 10 μm×10 μm or more, and may have a thickness of approximately 10 μm or less. However, this is merely an example.

Figure 27:
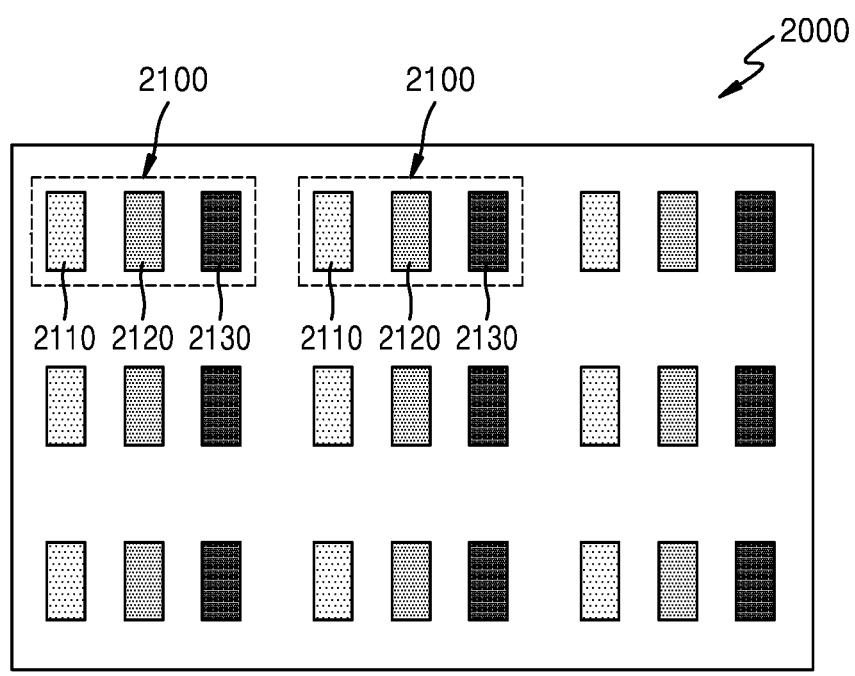
FIG. 27 is a schematic plan view of a display apparatus according to an embodiment.

FIG. 27 is a schematic plan view of a display apparatus 2000 according to an embodiment. The display apparatus 2000 illustrated in FIG. 27 may be, for example, a micro LED display apparatus. However, the present embodiment is not limited thereto.

Referring to FIG. 27, the display apparatus 2000 includes a plurality of unit pixels 2100. The plurality of unit pixels 2100 may be two-dimensionally (2D) arranged. For convenience, nine unit pixels 2100 are illustrated in FIG. 27. In order to implement a color image, each of the plurality of unit pixels 2100 of the display apparatus 2000 may include pixels of different colors. For example, each of the unit pixels 2100 may include first, second, and third pixels 2110, 2120, and 2130 of different colors. As a specific example, the first, second, and third pixels 2110, 2120, and 2130 may be blue, green, and red pixels, respectively. However, the present embodiment is not limited thereto.

The first, second, and third pixels 2110, 2120, and 2130 may include first, second, and third LED devices that respectively emit light in different wavelength bands. For example, when the first, second, and third pixels 2110, 2120, and 2130 respectively are blue, green, and red pixels, the first, second, and third LED devices respectively are red, green, and blue LED devices. Each of the first, second, and third LED devices may be LED devices 1000, 1100, 1200, 1300, and 1400 according to the embodiments described above, and thus, detailed descriptions thereof will be omitted.

The first, second, and third pixels 2110, 2120, and 2130 may include a plurality of LED devices emitting light of the same wavelength band. For example, when the first, second, and third pixels 2110, 2120, and 2130 respectively are blue, green, and red pixels, the first, second, and third pixels 2110, 2120, and 2130 all may include a blue LED device. In this case, the second pixel 2120, which is a green pixel may further include a green conversion layer that converts blue light into green light, and the third pixel 2130, which is a red pixel, may further include a red conversion layer that converts blue light into red light.

Also, for example, when the first, second, and third pixels 2110, 2120, and 2130 respectively are blue, green, and red pixels, the first, second and third pixels 2110, 2120, and 2130 all may include ultraviolet LED devices. In this case, the first pixel 2110, which is a blue pixel, may further include a blue conversion layer that converts ultraviolet light into blue light, the second pixel 2120, which is a green pixel, may further include a green conversion layer that converts ultraviolet light into green light, and the third pixel 2130, which is a red pixel, may further include a red conversion layer that converts ultraviolet light into red light.

According to an embodiment of the present disclosure, stress that may be caused in a light-emitting layer may be reduced since the light-emitting layer is grown on a crystallized membrane separated from a substrate with a cavity therebetween, and accordingly, a high-quality light-emitting layer with a low defect density may be formed. Therefore, an LED device that may have high efficiency, high reliability, and increase light extraction efficiency may be realized.

Also, since a passivation layer is formed to cover an end of an active layer on an upper surface of a light-emitting layer, the current injection characteristic and light extraction efficiency of the LED device may be increased.

In addition, light emitted from an active layer and directed to a side surface of a light-emitting layer is enclosed inside the light-emitting layer by forming an electrode covering the side surface of the light-emitting layer, and thus, the light extraction efficiency of the LED device may further be increased.

The embodiments described above are merely examples, and therefore, it will be understood by those skilled in the art that various changes in form and details may be made therein without departing from the spirit and scope of the present disclosure.

What is claimed is:

1. A light-emitting diode (LED) device comprising:
a light-emitting layer having a core-shell structure that comprises a first semiconductor layer, an active layer, and a second semiconductor layer;
a passivation layer formed to cover a side surface and at least a portion of an upper surface of the second semiconductor layer;
a first electrode formed on a portion of the passivation layer that is located on a side surface of the light-emitting layer, the first electrode electrically connected to the first semiconductor layer and comprising a reflective material; and
a second electrode formed on a portion of the passivation layer that is located on an upper surface of the light-emitting layer, the second electrode contacting a portion of the upper surface of the second semiconductor layer that is exposed,
wherein the first semiconductor layer has a three-dimensional (3D) shape, the active layer is formed to cover an upper surface and a side surface of the first semiconductor layer, and the second semiconductor layer is formed to cover an upper surface and a side surface of the active layer,
wherein a side surface of the active layer is triple covered by the second semiconductor layer, the passivation layer, and the first electrode, and
wherein the LED device further comprises a transparent electrode covering a lower surface of the first semiconductor layer that is exposed, and the transparent electrode is directly on a part of the passivation layer, the part of the passivation layer under and directly contacting the lower surface of the first semiconductor layer and a lower surface of the active layer.

2. The LED device of claim 1, wherein the passivation layer covers an entirety of the side surface of the light-emitting layer, and further covers a portion of the lower surface of the first semiconductor layer and the portion of the upper surface of the second semiconductor layer.

3. The LED device of claim 2, wherein the first electrode extends to the portion of the passivation layer located on the upper surface of the light-emitting layer.

4. The LED device of claim 3, wherein the first electrode surrounds the entirety of the side surface of the light-emitting layer.

5. The LED device of claim 1, wherein the transparent electrode is electrically connected to the first electrode.

6. The LED device of claim 1, wherein the first electrode extends to contact the transparent electrode.

7. The LED device of claim 3, wherein a via hole for electrically connecting the first semiconductor layer to the first electrode is formed in the light-emitting layer.

8. The LED device of claim 7, wherein the via hole is formed in a region corresponding to the first electrode on the light-emitting layer.

9. The LED device of claim 7, wherein the first electrode is separated from an end of the active layer and an end of the second semiconductor layer exposed by the via hole with the passivation layer therebetween.

10. The LED device of claim 7, wherein the first electrode is formed to cover the entirety of the side surface of the light-emitting layer.

11. The LED device of claim 1, wherein the first electrode is a reflective electrode.

12. The LED device of claim 6, wherein the LED device has a size of 10 μm×10 μm or less.

13. A display apparatus comprising:
a plurality of pixels that are two-dimensionally (2D) arranged and are configured to emit light of different colors, wherein the plurality of pixels comprises a plurality of light-emitting diode (LED) devices,
wherein each of the plurality of LED devices comprises:
a light-emitting layer having a core-shell structure that comprises a first semiconductor layer, an active layer, and a second semiconductor layer;
a passivation layer formed to cover a side surface and at least a portion of an upper surface of the second semiconductor layer;
a first electrode provided on a portion of the passivation layer that is located on a side of the light-emitting layer, the first electrode electrically connected to the first semiconductor layer and comprising a reflective material; and
a second electrode formed on a portion of the passivation layer that is located on an upper surface of the light-emitting layer, the second electrode contacting a portion of the upper surface of the second semiconductor layer that is exposed,
wherein the first semiconductor layer has a three-dimensional (3D) shape, the active layer is formed to cover an upper surface and a side surface of the first semiconductor layer, and the second semiconductor layer is formed to cover an upper surface and a side surface of the active layer,
wherein a side surface of the active layer is triple covered by the second semiconductor layer, the passivation layer, and the first electrode, and
wherein each LED device from among the plurality of LED devices further comprises a transparent electrode covering a lower surface of the first semiconductor layer, of the LED device, that is exposed, and the transparent electrode is directly on a part of the passivation layer of the LED device, the part of the passivation layer under and directly contacting the lower surface of the first semiconductor layer of the LED device and a lower surface of the active layer of the LED device.

\* \* \* \* \*